United States Patent
Satou et al.

(10) Patent No.: US 11,546,521 B2
(45) Date of Patent: *Jan. 3, 2023

(54) CAMERA SYSTEM AND TRAVELING CONTROL SYSTEM

(71) Applicant: PANASONIC INTELLECTUAL PROPERTY MANAGEMENT CO., LTD., Osaka (JP)

(72) Inventors: Yoshiaki Satou, Kyoto (JP); Sanshiro Shishido, Osaka (JP); Yasuo Miyake, Osaka (JP); Kazuko Nishimura, Kyoto (JP); Hiroshi Iwai, Osaka (JP); Osamu Shibata, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/405,501

(22) Filed: Aug. 18, 2021

(65) Prior Publication Data

US 2021/0385366 A1 Dec. 9, 2021

Related U.S. Application Data

(63) Continuation of application No. 16/257,587, filed on Jan. 25, 2019, now Pat. No. 11,128,806.

(30) Foreign Application Priority Data

Feb. 9, 2018 (JP) ............................. JP2018-021977

(51) Int. Cl.
*H04N 5/235* (2006.01)
*H04N 5/232* (2006.01)
(Continued)

(52) U.S. Cl.
CPC ............. *H04N 5/2353* (2013.01); *G06T 7/73* (2017.01); *H04N 5/23229* (2013.01)

(58) Field of Classification Search
None
See application file for complete search history.

(56) References Cited

U.S. PATENT DOCUMENTS 11,128,806 B2 * 9/2021 Satou ..................... H04N 5/353
2007/0171298 A1 7/2007 Kurane
(Continued)

FOREIGN PATENT DOCUMENTS

JP 2002-027315 1/2002
JP 2002-148270 5/2002
(Continued)

OTHER PUBLICATIONS

Non-Final Office Action issued in U.S. Appl. No. 16/257,587, dated Jul. 8, 2020.
(Continued)

*Primary Examiner* — Mark T Monk
(74) *Attorney, Agent, or Firm* — McDermott Will & Emery LLP

(57) ABSTRACT

A camera system including an imaging device that captures a first image by a normal exposure including only one exposure and that captures a second image by a multiple exposure including a plurality of exposures; and a control circuit. The the imaging device captures the second image in a first frame period, and the control circuit determines, based on the second image captured in the first frame period, whether to capture an image by the normal exposure or capture an image by the multiple exposure in a second frame period following the first frame period.

16 Claims, 20 Drawing Sheets

(51) Int. Cl.
    *H01L 27/146*    (2006.01)
    *G06T 7/73*    (2017.01)

(56) References Cited

U.S. PATENT DOCUMENTS

2014/0066198 A1    3/2014    Robbins et al.
2014/0362256 A1    12/2014    Schulze et al.

FOREIGN PATENT DOCUMENTS

JP    2010-244301    10/2010
JP    2018-056881    4/2018

OTHER PUBLICATIONS

Final Office Action issued in U.S. Appl. No. 16/257,587, dated Jan. 28, 2021.
Notice of Allowance issued in U.S. Appl. No. 16/257,587, dated May 19, 2021.

\* cited by examiner

CAMERA SYSTEM AND TRAVELING CONTROL SYSTEM

CROSS-REFERENCE OF RELATED APPLICATIONS

This application is a Continuation of U.S. patent application Ser. No. 16/257,587, filed on Jan. 25, 2019, now U.S. Pat. No. 11,128,806, which in turn claims the benefit of Japanese Application No. 2018-021977, filed on Feb. 9, 2018, the entire disclosures of which Applications are incorporated by reference herein.

BACKGROUND

1. Technical Field

The present disclosure relates to a camera system.

2. Description of the Related Art

A camera system is known which includes an imaging device configured to acquire a multiple exposure image by performing an exposure a plurality of times. For example, Japanese Unexamined Patent Application Publication No. 2002-27315 discloses a camera system in which a feature value of a subject is extracted from a multiple exposure image acquired by an imaging device, and a location of the subject in the multiple exposure image is identified based on the extracted feature value.

SUMMARY

There is a need for a camera system capable of more accurately identifying a location of a subject in a multiple exposure image.

In one general aspect, the techniques disclosed here feature a camera system including an imaging device that captures a first image by a normal exposure including only one exposure and that captures a second image by a multiple exposure including a plurality of exposures; and a control circuit, where the imaging device captures the second image in a first frame period, and the control circuit determines, based on the second image captured in the first frame period, whether to capture an image by the normal exposure or capture an image by the multiple exposure in a second frame period following the first frame period.

It should be noted that general or specific embodiments may be implemented as an element, a device, an apparatus, a camera system, an integrated circuit, a method, a computer program, or a computer-readable storage medium in which a program is stored. It should be noted that general or specific embodiments may be implemented by any selective combination of an element, a device, an apparatus, a camera system, an integrated circuit, a method, a computer program, or a computer-readable storage medium in which a program is stored.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
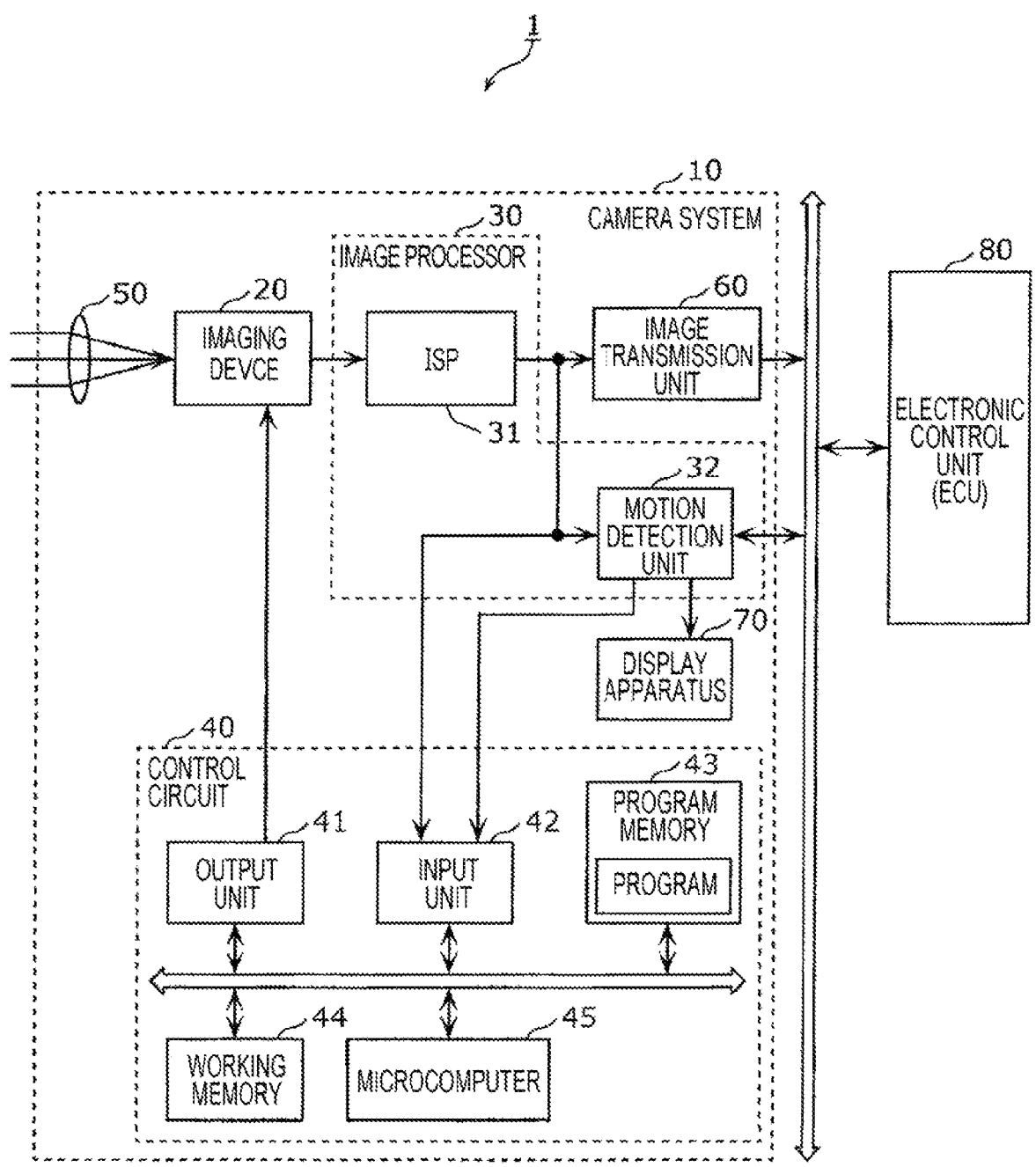
FIG. 1 is a block diagram illustrating a configuration of a traveling control system according to a first embodiment.

Underlying Knowledge Forming Basis of the Present Disclosure

In a case where a subject moves relative to an imaging device, when a multiple exposure image is acquired by the imaging device, a plurality of subject images are superimposed at locations shifted from each other. In such a situation, a conventional camera system may make an error in detecting a shape of or the number of subject images from a multiple exposure image. Such an erroneous detection may result in a reduction in accuracy in identifying a location of a subject image in a multiple exposure image. In view of the above, the present disclosure provides a camera system in various aspects as summarized below.

Aspect 1

A camera system includes an imaging device that acquires a first image by a normal exposure including only one exposure and that acquires a second image by a multiple exposure including a plurality of exposures; and an image processor that extracts a feature value of a first object in the first image and that identifies one or more locations corresponding to the feature value in the second image.

Aspect 2

In the camera system described in Aspect 1, the imaging device may acquire the first image in a first frame period and that acquires the second image in a second frame period following the first frame period.

Aspect 3

The camera system described in Aspect 2 may further include a control circuit that determines, based on the second image, whether to acquire an image by the normal exposure or acquire an image by the multiple exposure in a third frame period following the second frame period.

Aspect 4

In the camera system described in Aspect 4, in a case where the one or more locations corresponding to the feature value cannot be identified in the second image, the control circuit determines to acquire an image by the normal exposure in the third frame period.

Aspect 5

In the camera system described in Aspect 3 or 4, in a case where a second object different from the first object is detected in the second image, the control circuit determines to acquire an image by the normal exposure in the third frame period.

Aspect 6

In the camera system described in Aspect 3 or 4, in a case where a second object different from the first object is detected in a first area of the second image, the control circuit determines to acquire an image by the normal exposure in the third frame period.

Aspect 7

In the camera system described in one of Aspects 1 to 6, the imaging device may nondestructively read out a signal generated by an exposure out of the multiple exposure.

Aspect 8

In the camera system described in Aspect 7, the imaging device may include pixels and nondestructively reads out the signal from a pixel out of the pixels.

Aspect 9

In the camera system described in Aspect 1, the imaging device may acquire the first image and the second image in a first frame period, and the imaging device may acquire the first image by a first exposure out of the multiple exposure and acquires the second image by the multiple exposure, the imaging device.

Aspect 10

In the camera system described Aspect 9, the imaging device may nondestructively read out a signal generated in the first exposure.

Aspect 11

In the camera system described in one of Aspects 1 to 10, the multiple exposure may include a first exposure and a second exposure different from the first exposure, and a sensitivity in the first exposure may be different from a sensitivity in the second exposure.

Aspect 12

In the camera system described in one of Aspects 1 to 11, a sensitivity in a period between adjacent two exposures out of the multiple exposure may be greater than zero and less than a sensitivity in each of the adjacent two exposures.

Aspect 13

In the camera system described in one of Aspects 1 to 12, the first object may include at least a car, a motorcycle, a train, a bicycle, a person, or an animal.

Aspect 14

In the camera system described in one of Aspects 1 to 13, the image processor may calculate, based on the second image, at least a direction of movement, a velocity, or an acceleration of the first object.

Aspect 15

The camera system described in Aspect 14 may further include a display apparatus that displays at least the direction of movement, the velocity, or the acceleration calculated by the image processor.

Aspect 16

In the camera system described in Aspect 1, the image processor may detect, based on the feature value of the first object, one or more object images corresponding to the first object in the second image.

Aspect 17

A traveling control system includes the camera system according to claim 1; and a controller, wherein the camera system calculates, based on the second image, at least direction of movement, a velocity, or an acceleration of the first object, and the controller controls, based on the at least the direction of movement, the velocity, or the acceleration calculated by the camera system, a travel state of a moving body.

Aspect 18

A camera system includes;

an imaging device that acquires a first image by one or more exposures and that acquires a second image by a multiple exposure including a plurality of exposures; and an image processor that extracts a feature value of a first object in the first image and that identifies one or more locations corresponding to the feature value in the second image.

Aspect 19

In the camera system described in Aspect 18;

the imaging device may acquire the first image and the second image in a first frame period, and the imaging device may acquire the first image by first one or more exposures out of the multiple exposure and acquires the second image by the multiple exposure.

Aspect 20

In the camera system described in Aspect 18, the image processor may detect, based on the feature value of the first object, one or more object images corresponding to the first object in the second image.

In an aspect of the present disclosure, a camera system includes an imaging device that acquires an image and an image processor that performs an image processing, wherein the imaging device acquires a first image by performing one exposure and acquires a second image by performing a plurality of exposures, and the image processor extracts a feature value of a first object from the first image and identifies a location of the first object in the second image based on the feature value.

This camera system extracts a feature value of the first object, that is, the subject, from the first image which is not a multiple exposure image. Using the extracted feature value, a plurality of images of the first object are extracted from the multiple exposure image. Thus, this camera system is capable of reducing the probability of erroneously detecting the shape of and/or the number of the subject images compared with the conventional camera system configured to extract a feature value of a subject image from a multiple exposure image.

Thus, this camera system is capable of providing an improved accuracy in identifying a location of a subject in a multiple exposure image.

For example, the imaging device may perform the first-time exposure in the first frame period and may perform the plurality of exposures in the second frame period following the first frame period.

This makes it possible to start extracting the feature value of the first object before the acquisition of the second image is started or in parallel to the acquisition of the second image.

For example, the camera system may further include a control circuit that controls the imaging device. The control circuit may determine, based on the second image, whether the imaging device is to perform the one exposure or the plurality of exposures in a third frame period following the second frame period.

This makes it possible to dynamically determine whether the exposure performed in the third frame period is to be one exposure or a plurality of exposures.

For example, in a case where the image processor detects no first object in the second image, the control circuit may determine that the imaging device is to perform the one exposure in the third frame period.

This makes it possible to acquire, in the third frame period, an image for extracting a feature value of a new object.

For example, in a case where the image processor detects a second object different from the first object in the second image, the control circuit may determine that the imaging device is to perform the one exposure in the third frame period.

This makes it possible to acquire, in the third frame period, an image for extracting the feature value of the second object.

For example, in a case where the image processor detects a second object different from the first object in a predetermined particular area which is part of the second image, the control circuit may determine that the imaging device is to perform the one exposure in the third frame period.

This makes it possible to reduce the amount of processing in the process of determining whether to perform one exposure or a plurality of exposures in the third frame period.

For example, nondestructive reading may be performed on a charge obtained by at least one exposure in the plurality of exposure.

This makes it possible to acquire an image obtained by the at least one exposure and an exposure previous to the at least one exposure.

For example, the nondestructive charge reading may be performed on part of pixels included in the imaging device.

This makes it possible to reduce the reading time in the nondestructive reading and/or the power consumption in the nondestructive reading compared with a case where the nondestructive reading is performed on all pixels included in the imaging device.

For example, the one exposure may be a first exposure in the plurality of exposures, and the imaging device may perform the plurality of exposures in the same frame period.

This makes it possible to start extracting the feature value of the first object before the acquisition of the second image is started or in parallel to the acquisition of the second image.

For example, the charge obtained by the one exposure may be read out nondestructively.

This makes it possible to superimpose an image of a subject acquired by the one exposure on the second image.

For example, the plurality of exposures may include a first exposure performed with a first exposure sensitivity and a second exposure performed with a second exposure sensitivity different from the first exposure sensitivity.

This makes it possible to obtain images of a subject superimposed on the second image such that the luminance of the image of the object acquired by the first exposure is different from the luminance of the image of the subject acquired by the second exposure.

For example, the plurality of exposures each may be a high-sensitivity exposure performed with a particular exposure sensitivity, and the imaging device may perform the plurality of exposures such that the high-sensitivity exposure and the low-sensitivity exposure are performed alternately and successively.

This makes it possible to form, on the second image, a trajectory indicating time series locations of a subject.

For example, the first object may be one of a car, a motorcycle, a train, a bicycle, a person, and an animal.

This makes it possible to identify a location of a car, a motorcycle, a train, a bicycle, a person, or an animal on the second image.

For example, the image processor may calculate at least one of a direction of movement, a velocity, and an acceleration of the first object based on the second image.

This makes it possible to calculates at least one of the direction of movement, the velocity, and the acceleration of the first object.

For example, the camera system may further include a display apparatus that displays at least one of the direction of movement, the velocity, and the acceleration.

This makes it possible for a user of the camera system to visually recognize at least one of the direction of movement, the velocity, and the acceleration of the first object.

According to an aspect, the present disclosure provide a vehicle traveling control system that controls traveling of a vehicle. The traveling control system includes a camera system, wherein the image processor calculates at least one of a direction of movement, a velocity, and an acceleration of the first object based on the second image, and the vehicle traveling control system performs the control described above based on at least of one the direction of movement, the velocity, and the acceleration.

Thus, the vehicle traveling control system is capable of controlling the traveling of the vehicle based on at least one of the direction of movement, the velocity, and an acceleration of the first object.

Specific examples of the camera system and the traveling control system according to the aspect of the present disclosure are described below with reference to drawings. Note that each embodiment described below is for illustrating a specific example of the present disclosure. Therefore, in the following embodiments of the present disclosure, values, shapes, constituent elements, locations of elements, manners of connecting elements, steps, the order of steps, and the like are described by way of example but not limitation.

Among constituent elements described in the following embodiments, those constituent elements that are not described in independent claims are optional. Note that each drawing is a schematic diagram, which does not necessarily provide a strict description.

First Embodiment

A configuration of a camera system according to a first embodiment and a configuration of a traveling control system according to the first embodiment are described below with reference to drawings.

1.1 Configuration

FIG. 1 is a block diagram illustrating a configuration of a traveling control system 1. The traveling control system 1 is installed in a vehicle and controls traveling of the vehicle.

As shown in FIG. 1, the traveling control system 1 includes a camera system 10, and an electronic control unit 80.

The camera system 10 includes an imaging device 20, an image processor 30, a control circuit 40, an optical system 50, an image transmission unit 60, and a display apparatus 70.

The optical system 50 includes a set of lens including a plurality of lenses. The optical system 50 focuses light incident from the outside of the camera system 10 onto the imaging device 20. The set of lenses may include a focus lens. The focus lens may adjust a focal position of a subject image in the imaging device 20 by moving the set of lenses in an optical axis direction.

The imaging device 20 acquires an image. The imaging device 20 may be, for example, a CMOS (Complementary Metal Oxide Semiconductor) image sensor.

Figure 2:
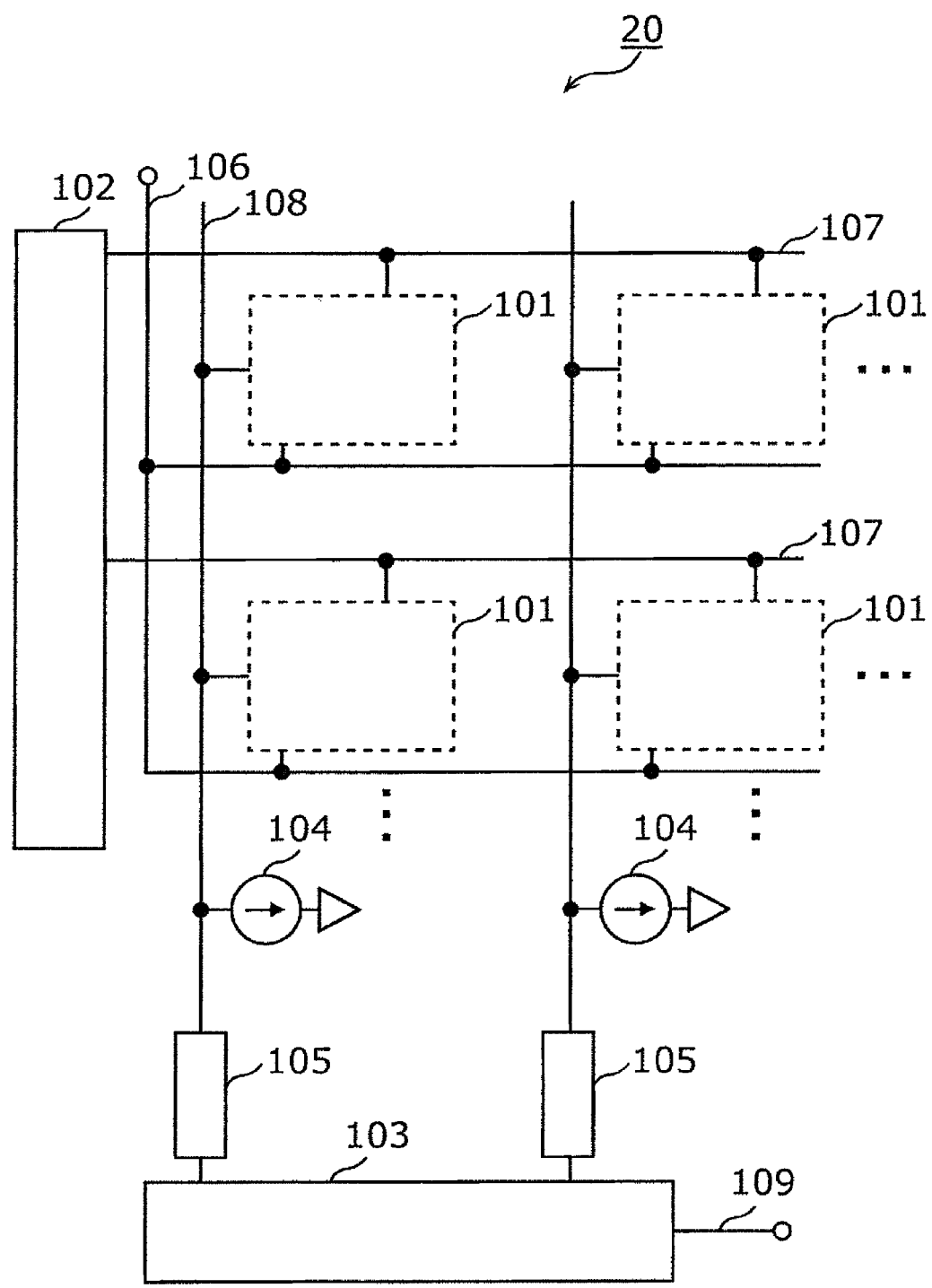
FIG. 2 is a schematic diagram illustrating an example of a circuit configuration of an imaging device according to the first embodiment.

FIG. 2 is a schematic diagram illustrating an example of a circuit configuration of the imaging device 20. In the example shown in FIG. 2, it is assumed that the imaging device 20 is a CMOS image sensor.

As shown in FIG. 2, the imaging device 20 includes a plurality of pixels 101 arranged in the form of a matrix, a row scanning circuit 102, a column scanning circuit 103, current sources 104 provided in respective columns, and AD (Analog to Digital) conversion circuits 105 provided in respective columns.

Pixels 101 located in each one of the rows are connected together to the row scanning circuit 102 via a common horizontal signal line 107. Pixels 101 located in each one of the columns are connected together to the column scanning circuit 103 via a common vertical signal line 108 and a common AD conversion circuit 105. Power is supplied to each pixel 101 via a power supply line 106 shared by all pixels 101.

In the example of the configuration shown in FIG. 2, the AD conversion circuits 105 are provided in the respective columns such that a digital signal is output from the column scanning circuit 103. However, the AD conversion circuits 105 may not be provided, and an analog signal may be output from the column scanning circuit 103. The column scanning circuit 103 may include, in each column, an adder/subtractor circuit that performs addition or subtraction on the signals given from pixels 101 located in the column and outputs a result of the addition or subtraction operation.

Each pixel 101 includes a photoelectric conversion element that performs a photoelectric conversion. The photoelectric conversion element may be, for example, of a type using a photoelectric conversion film or a type realized using a photodiode formed in a semiconductor substrate.

Figure 3:
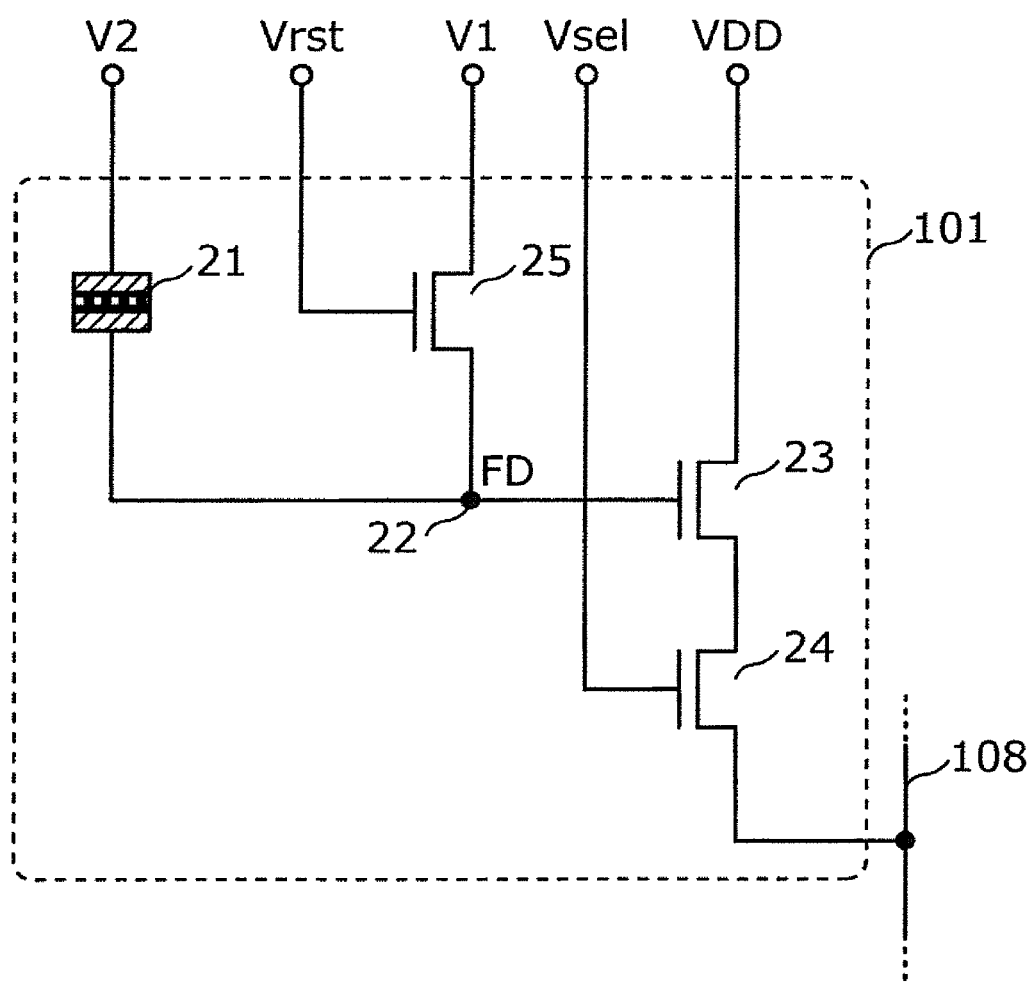
FIG. 3 is a circuit diagram illustrating an example of a circuit configuration of one pixel according to the first embodiment.

FIG. 3 is a circuit diagram illustrating an example of a circuit configuration of one pixel 101. In FIG. 3, the pixel 101 includes a photoelectric conversion element using a photoelectric conversion film.

As shown in FIG. 3, the pixel 101 includes a photoelectric conversion element 21, a floating diffusion layer (hereinafter, referred to as "FD") 22, an amplifier transistor 23, a selection transistor 24, and a reset transistor 25.

The photoelectric conversion element 21 performs a photoelectric conversion on incident light. The FD 22 accumulates a charge generated in the photoelectric conversion element 21.

Figure 4:
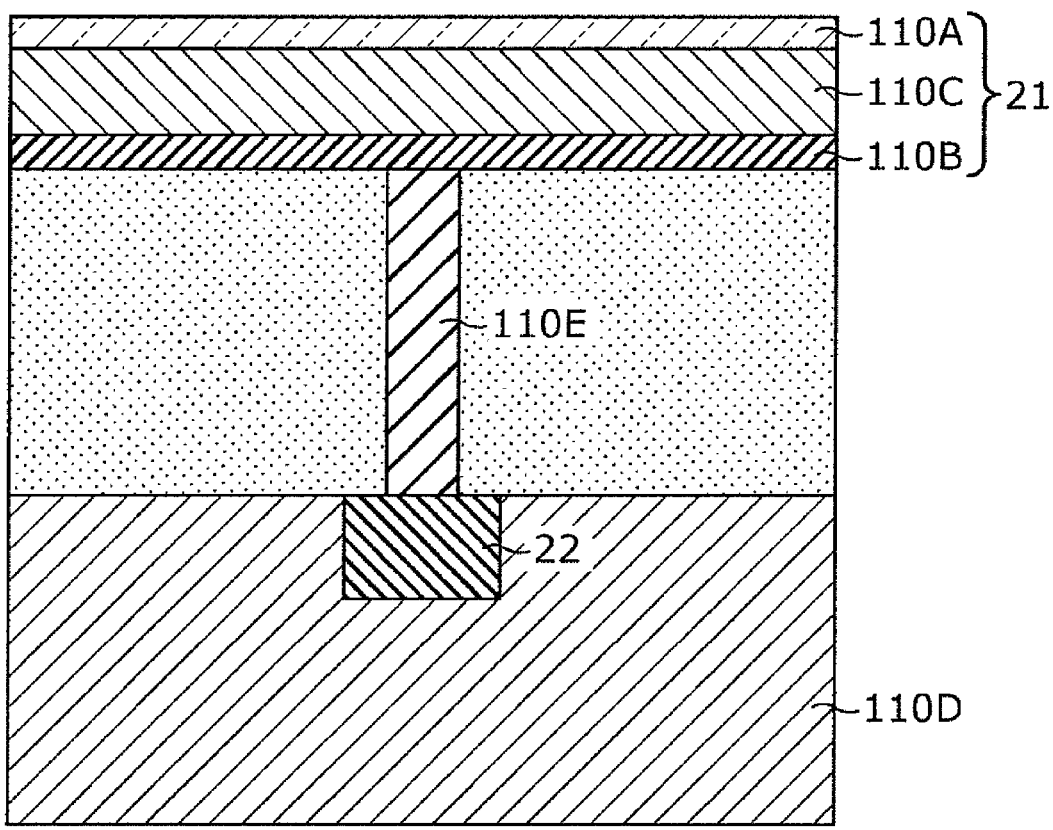
FIG. 4 is a cross-sectional view schematically illustrating a structure including a photoelectric conversion element and an FD according to the first embodiment.

FIG. 4 is a cross-sectional view schematically illustrating a structure including the photoelectric conversion element 21 and the FD 22 shown in FIG. 3.

As shown in FIG. 4, the photoelectric conversion element 21 includes a thin-film photoelectric conversion layer 110C, a thin-film transparent electrode 110A located above the photoelectric conversion layer 110C, and a thin-film pixel electrode 1106 located below the photoelectric conversion layer 110C. The pixel electrode 1106 is connected, via a contact plug 110E, to the FD 22 formed in the semiconductor substrate 110D. The FD 22 is, for example, a diffusion layer including an impurity.

When light is incident on the photoelectric conversion layer 110C in a state in which a bias voltage is applied between the transparent electrode 110A and the pixel electrode 110B, charges are generated by a photoelectric effect. Of the generated charges, a charge of either positive or negative type is collected by the pixel electrode 110B. The charge collected by the pixel electrode 110B is accumulated in the FD 22.

By changing the bias voltage applied to the photoelectric conversion layer 110C, it is possible to change a photoelectric conversion efficiency of the photoelectric conversion layer 110C, that is, the sensitivity of the photoelectric conversion layer 110C. More specifically, for example, when the bias voltage applied to the photoelectric conversion layer 110C is relatively high, the photoelectric conversion efficiency, that is, the sensitivity, of the photoelectric conversion layer 110C is relatively high. Conversely, when the bias voltage applied to the photoelectric conversion layer 110C is relatively low, the photoelectric conversion efficiency, that is, the sensitivity, of the photoelectric conversion layer 110C is relatively low.

Furthermore, by changing the bias voltage applied to the photoelectric conversion layer 110C such that the bias voltage is smaller than a particular threshold value, it is possible to set the photoelectric conversion efficiency of the photoelectric conversion layer 110C to be substantially equal to 0. Hereinafter, this threshold value is referred to as an exposure threshold value.

That is, by changing the bias voltage applied to the photoelectric conversion layer 110C between a value greater than the exposure threshold value and a value smaller than the exposure threshold value, it is possible to change the state of the photoelectric conversion element 21 between an exposure state and a non-exposure state. This makes it possible for the imaging device 20 to perform a multiple exposure operation in which an exposure is performed a plurality of times intermittently.

Referring again to FIG. 3, the pixel 101 is further explained.

When the reset transistor 25 is turned on-state by applying a Vrst signal, the electric potential of the FD 22 is reset to a desired reset potential V1.

The amplifier transistor 23 outputs a signal corresponding to the amount of charge accumulated in the FD 22.

By switching the state of the selection transistor 24 between the on-state and the off-state using a Vsel signal, a selection is made as to whether a signal output from the amplifier transistor 23 is output to the vertical signal line 108 or not.

Figure 5:
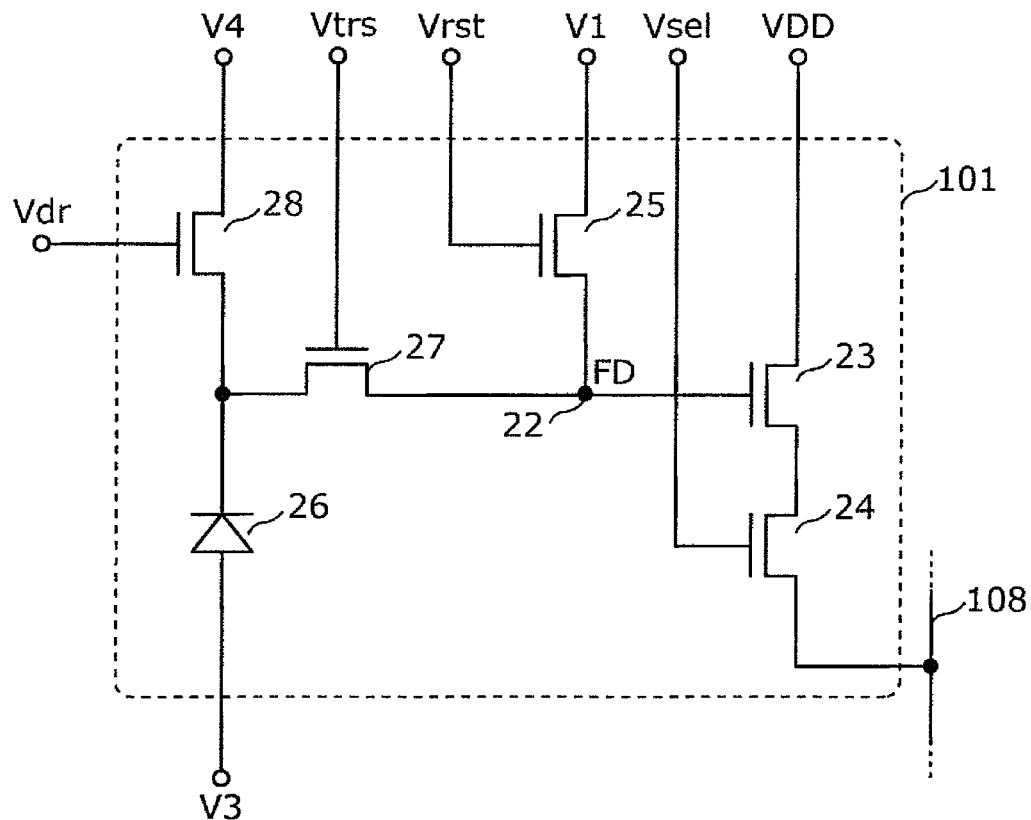
FIG. 5 is a circuit diagram illustrating an example of a circuit configuration of one pixel according to the first embodiment.

FIG. 5 is a circuit diagram illustrating another example of a circuit configuration of one pixel 101. In the example shown in FIG. 5, the pixel 101 includes a photodiode functioning as the photoelectric conversion element.

As shown in FIG. 5, the pixel 101 includes a photodiode 26, a floating diffusion layer (hereinafter referred to as "FD") 22, an amplifier transistor 23, a selection transistor 24, a reset transistor 25, a transfer transistor 27, and a discharge transistor 28.

The photodiode 26 performs a photoelectric conversion on incident light.

When the transfer transistor 27 is switched into the on-state in response to the Vtrs signal, the charged generated in the photodiode 26 is transferred to the FD 22.

When the discharge transistor 28 is switched into the on-state in response to the Vdr signal, the charge generated in the photodiode 26 is discharged.

In the imaging device 20, of a total charge generated in the photodiode 26, a charge arising from an exposure intended to be effective is transferred to the FD 22 via the transfer transistor 27 while a charge arising from an exposure intended to be ineffective is discharged via the discharge transistor 28. This makes it possible to perform a multiple exposure operation in which an exposure is performed a plurality of times intermittently.

Referring again to FIG. 1, the traveling control system 1 is further explained.

The image processor 30 performs various processes on the image acquired by the imaging device 20. A first moving object detection process performed by the image processor 30 will be described later with reference to a flow chart.

As shown in FIG. 1, the image processor 30 includes an image signal processor (hereafter referred to as "ISP") 31, and a motion detection unit 32.

The ISP 31 mainly performs a correction process and/or the like.

The motion detection unit 32 mainly performs an extraction of a feature value and processes associated with a moving object, such as a motion detection, a moving object detection, and/or the like on an image output from the ISP 31. The motion detection unit 32 includes, for example, a processor which executes a program to achieve the processes associated with the moving object. The motion detection unit 32 may include a frame memory for storing an image and/or a memory for storing a program, an extracted feature value and/or other data.

The image transmission unit 60 outputs data such as image data input from the ISP 31 to an external unit. The external unit is, for example, the electronic control unit 80. The image data output from the image transmission unit 60 may be, for example, uncompressed and unprocessed raw data or data in a particular format subjected to image compression and/or particular image processing.

The control circuit 40 controls the camera system 10. The control circuit 40 also controls the imaging device 20.

As shown in FIG. 1, the control circuit 40 may include, for example, an output unit 41, an input unit 42, a microcomputer 45, a program memory 43 for storing a program to be executed by the microcomputer 45, and a working memory 44 used by the microcomputer 45.

The display apparatus 70 displays information obtained as a result of the process performed by the motion detection unit 32. The display apparatus 70 may display, for example, at least one of the direction of movement, the velocity, and the acceleration calculated by the motion detection unit 32.

The electronic control unit 80 is a unit called an ECU (Engine Control Unit). The electronic control unit 80 controls an engine, braking, accelerating, and/or the like of a vehicle in which the electronic control unit 80 is installed. The electronic control unit 80 may perform the control described above based on, for example, at least one of the direction of movement, the velocity, and the acceleration calculated by the motion detection unit 32.

An operation performed by the camera system 10 configured in the above-described manner is described below with reference to drawings.

1.2 Operation 1.2.1 Image Capturing

The operation of capturing an image by the imaging device 20 is described in further detail below. The description is given below with reference to drawings for each of cases: a case in which the photoelectric conversion element is of a type using a photoelectric conversion film; and a case in which a photodiode is used as the photoelectric conversion element.

Figure 6:
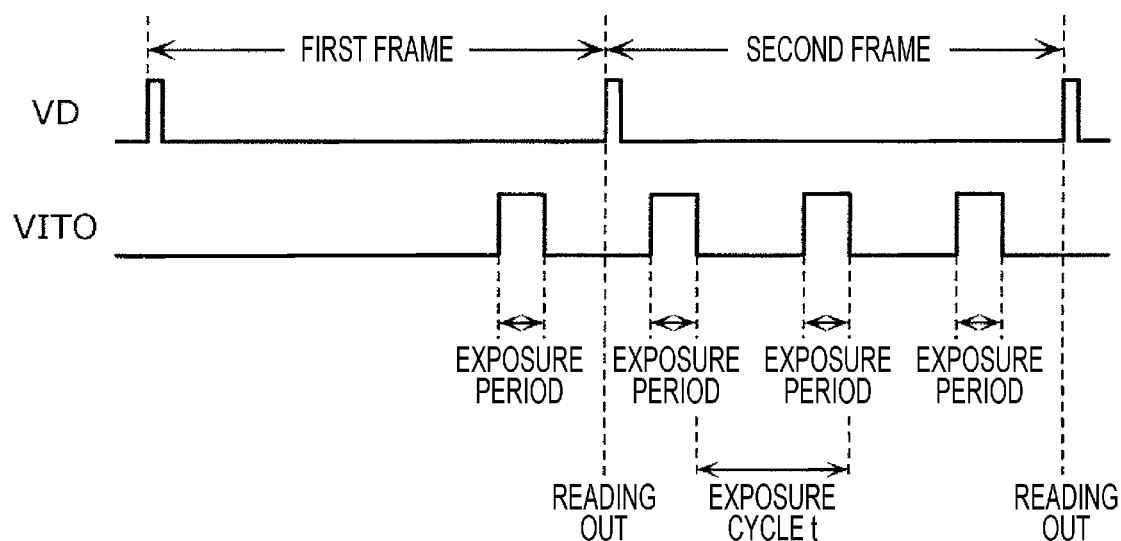
FIG. 6 is a diagram illustrating an example of operation timing in a normal exposure and a multiple exposure in two frame periods in an imaging device according to the first embodiment.

FIG. 6 illustrates an example of operation timing in a normal exposure and a multiple exposure in two frame periods. Note that each pixel 101 of the imaging device 20 includes a photoelectric conversion element using a photoelectric conversion film.

In FIG. 6, VD represents a change in vertical synchronization signal VD having a pulse form and changing at a predetermined frame rate (for example, 60 fps).

In synchronization with timing of rising of VD, the imaging device 20 reads out a pixel signal from each pixel 101 thereby acquiring an image. The pixel signal corresponds to the amount of charge accumulated in the FD 22.

In FIG. 6, VITO represents a change in the bias voltage VITO applied to the transparent electrode 110A. The bias voltage VITO can also be regarded as a voltage applied to the photoelectric conversion layer 110C. The bias voltage VITO is set alternately to a low level lower than the exposure threshold value and a high level higher than the exposure threshold value.

In the example shown in FIG. 6, VITO is set to the high level once in a first frame period while VITO is set to the high level three times in a second frame period following the first frame period. Thus, each pixel 101 has one exposure period in the first frame period and three exposure periods in the second frame period. That is, an image is acquired as a result of one exposure in the first frame period, while an image is acquired as a result of a plurality of exposures in the second frame period. Hereinafter, one exposure referred to a normal exposure and a plurality of exposures performed in one frame period is referred to as a multiple exposure. An image acquired by a normal exposure is referred as a reference image, and an image acquired by a multiple exposure is referred to as a multiple exposure image. For example, when an image is acquired by reading an amount of charge accumulated in the FD 22 in the first frame period in which an exposure occurs once in each pixel 101, a reference image is obtained as a result. When an image is acquired by reading an amount of charge accumulated in the FD 22 in the second frame period in which an exposure occurs a plurality of times in each pixel 101, a multiple exposure image is obtained as a result. For example, in a case where a subject moves relative to the imaging device 20, a multiple exposure image includes a plurality of subject images superimposed at locations shifted from each other in a direction corresponding to a direction in which the subject moves. On the other hand, a reference image include only single subject image regardless of whether a subject moves relative to the imaging device 20. In other words, a reference image cannot be an image including a plurality of subject images superimposed at locations shifted from each other in a direction corresponding to a direction in which the subject moves.

Figure 7A:
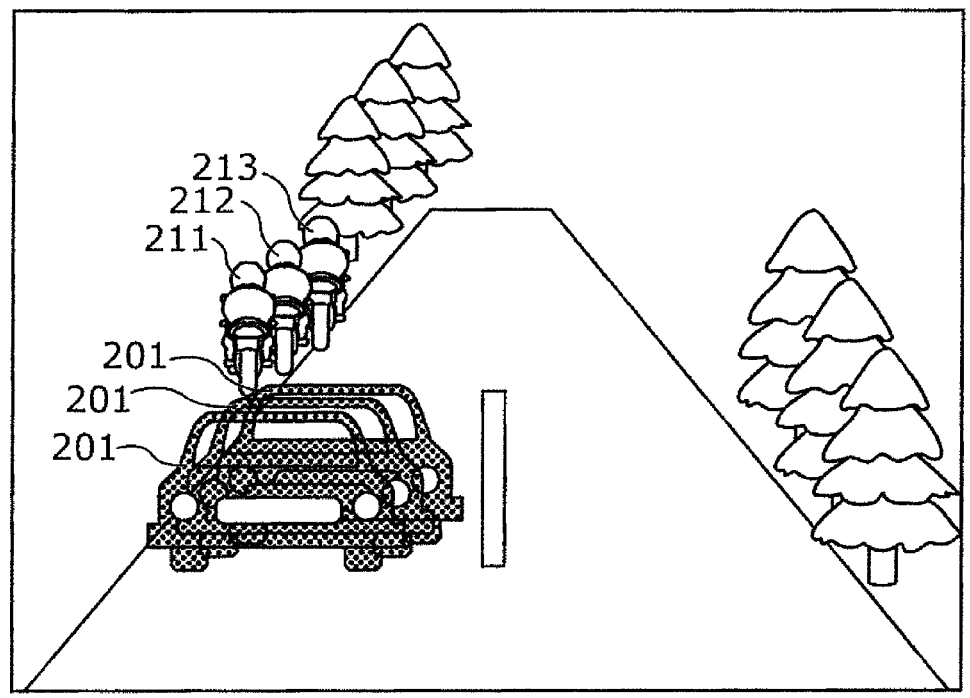
FIG. 7A is a diagram illustrating an example of a multiple exposure image acquired by an imaging device according to the first embodiment.
Figure 7B:
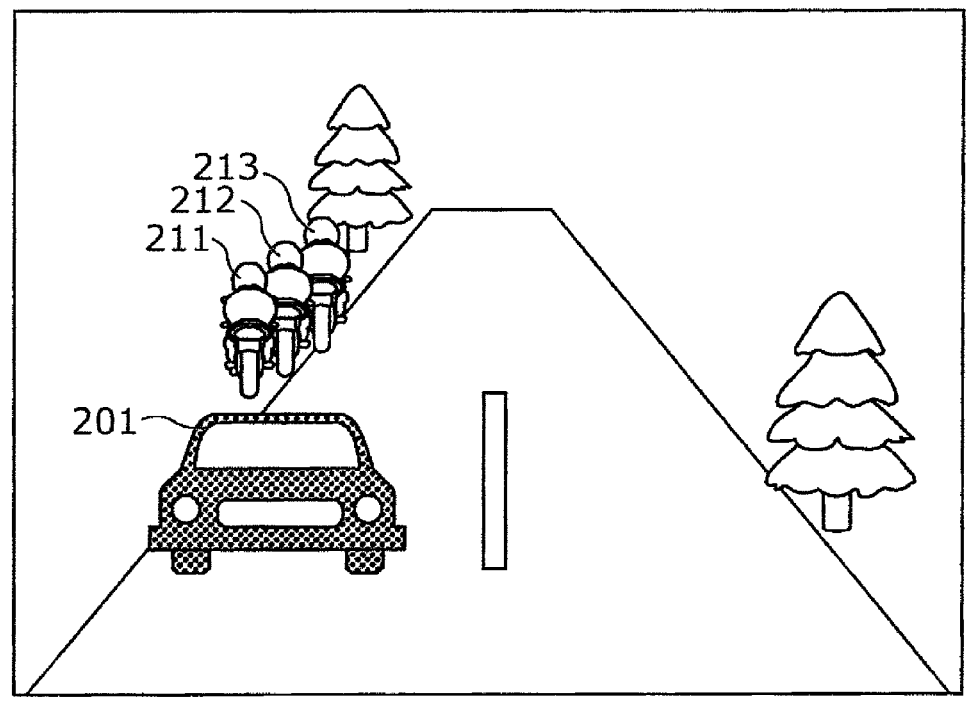
FIG. 7B is a diagram illustrating an example of a reference image acquired by an imaging device according to the first embodiment.

FIG. 7A illustrates an example of a multiple exposure image acquired by an imaging device 20 installed on a vehicle. FIG. 7B illustrates an example of a reference image acquired by the imaging device 20 installed on the vehicle.

FIG. 7A and FIG. 7B each are an example of an image ahead of the vehicle, acquired in a state in which another vehicle 201 and three motorcycles 211, 212, and 213 having similar external appearances traveling ahead of the vehicle. The vehicle 201 moves at a particular relative speed with respect to the vehicle, while the relative speed of each of motorcycles 211, 212, and 213 with respect to the vehicle is substantially zero.

As shown by way of example in FIG. 7A, in the multiple exposure image, a plurality of images of the same vehicle 201 are formed such that the images are formed at locations shifted from each other in a relative movement direction of the vehicle 201. On the other hand, a single image is obtained for each of the three motorcycles 211, 212, and 213 even in the multiple exposure image. Therefore, it may be relatively difficult from this multiple exposure image to determine whether the images of three motorcycles 211, 212, and 213 are images of different three motorcycles or images of one same motorcycle obtained by multiple exposure.

In contrast, in the reference image, as shown by way of example in FIG. 7B, a plurality of subject images are never obtained for one same subject.

Figure 8:
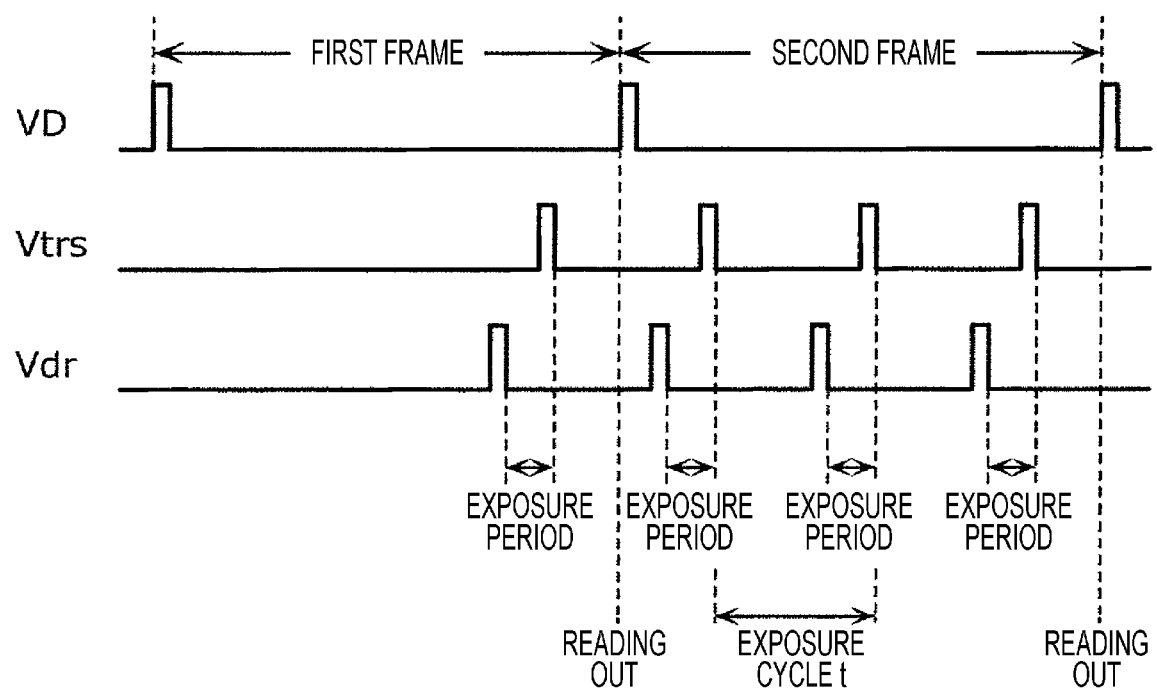
FIG. 8 is a diagram illustrating an example of operation timing in a normal exposure and a multiple exposure in two frame periods in an imaging device according to the first embodiment.

FIG. 8 illustrates an example of operation timing of the imaging device 20 in a normal exposure and a multiple exposure in two frame periods. In this example, it is assumed that each pixel 101 of the imaging device 20 includes a photodiode functioning as the photoelectric conversion element.

In FIG. 8, VD represents a change in vertical synchronization signal VD having a pulse form and changing at a predetermined frame rate (for example, 60 fps).

In synchronization with timing of rising of VD, the imaging device 20 reads out a pixel signal from each pixel 101 thereby acquiring an image. The pixel signal corresponds to the amount of charge accumulated in the FD 22.

In FIG. 8, Vtrs represents a change in a pulse signal Vtrs that controls the transfer transistor 27. When Vtrs is at the high level, the transfer transistor 27 is in the on-state, while when Vtrs is at the low level, the transfer transistor 27 is in the off-state. In other words, in a period in which Vtrs is at the high level, a charge generated in the photodiode 26 is transferred to the FD 22, while in a period in which Vtrs is at the low level, a charge generated in the photodiode 26 is not transferred to the FD 22.

In FIG. 8, Vdr represents a change in a pulse signal Vdr that controls the discharge transistor 28. When Vdr is at the high level, the discharge transistor 28 is in the on-state, while when Vdr is at the low level, the discharge transistor 28 is in the off-state. In other words, in a period from the beginning of a frame period to a time immediately before Vdr rises to the high level and a period from a time immediately after Vtrs falls to the low level to a time immediately before Vdr rises to the high level, a charge generated in the photodiode 26 is discharged, while in a period in which Vdr is at the low level, a charge generated in the photodiode 26 is not discharged.

Thus, an exposure period is given by a period from the falling-down of Vdr to the next falling-down of Vtrs.

In the example shown in FIG. 8, Vdr and Vtrs are set to the high level once in a first frame period while Vdr and Vtrs are set to the high level three times in a second frame period. In both periods, Vdr first rises to the high level and then Vtrs rises to the high level. Thus, each pixel 101 has one exposure period in the first frame period and three exposure periods in the second frame period. That is, an image is acquired as a result of one exposure in the first frame period, while in the second frame period, an image is acquired as a result of a plurality of exposures. When an image is acquired by reading an amount of charge accumulated in the FD 22 in the first frame period in which an exposure occurs once in each pixel 101, a reference image is obtained as a result. When an image is acquired by reading an amount of charge accumulated in the FD 22 in the second frame period in which an exposure occurs a plurality of times in each pixel 101, a multiple exposure image is obtained as a result.

1.2.2 First Moving Object Detection Process

The camera system 10 performs a first moving object detection process.

The first moving object detection process is described below with reference to drawings.

Figure 9:
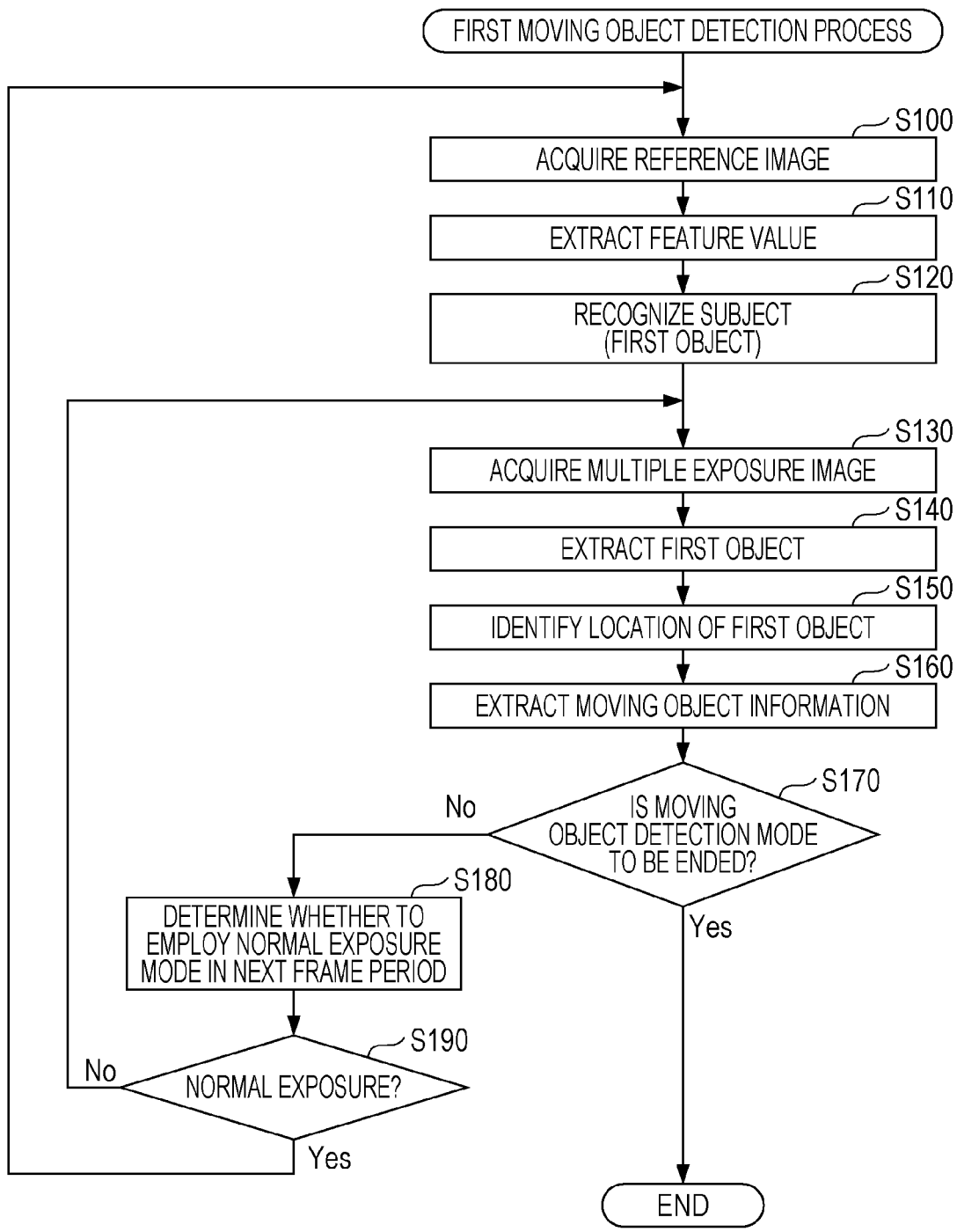
FIG. 9 is a flow chart illustrating a first moving object detection process.

FIG. 9 is a flow chart illustrating the first moving object detection process.

The first moving object detection process starts, for example, when the camera system 10 accepts an operation performed by a user of the camera system 10 to set the operation mode of the camera system 10 to a moving object detection mode.

As shown in FIG. 9, when the first moving object detection process starts, the imaging device 20 acquires a reference image by performing a normal exposure (step S100). An example of a reference image obtained here is shown in FIG. 7B.

When the reference image is acquired, the image processor 30 extracts a feature value of each of all subjects from the reference image. Based on each extracted feature value, the image processor 30 determines whether each subject is of a specific type whose motion vector is to be extracted (step S110). Hereinafter, a subject of the specific type whose motion vector is to be extracted is referred to as a "specific subject".

The feature value is a quantitative feature of a shape and is used in checking or identifying a subject. Examples of feature values include an edge pattern, a luminance pattern, a color pattern, and an aspect ratio. The edge pattern includes, for example, locations of vertices of the subject, the number of vertices, a gradient direction of an edge, and an angle of the edge. The luminance pattern is a quantified feature representing a distribution of luminance of an image. The color pattern is a quantified feature representing a distribution of color of an image. The aspect ratio represents a ratio of a width to a height of an image, or the like, quantified as a feature value. Other examples of feature values focused on relationships between local areas are a SIFT (Scale Invariant Feature Transform) feature value, a HOG (Histogram of oriented gradient) feature value, an EOH (Edge of Orientation Histograms) feature value, an Edgelet feature value, etc. Still other various feature values may also be extracted.

The specific subject is, for example, an object that can autonomously move. Specific examples of specific subjects are a car, a motorcycle, a train, a bicycle, a person, and an animal.

Figure 10:
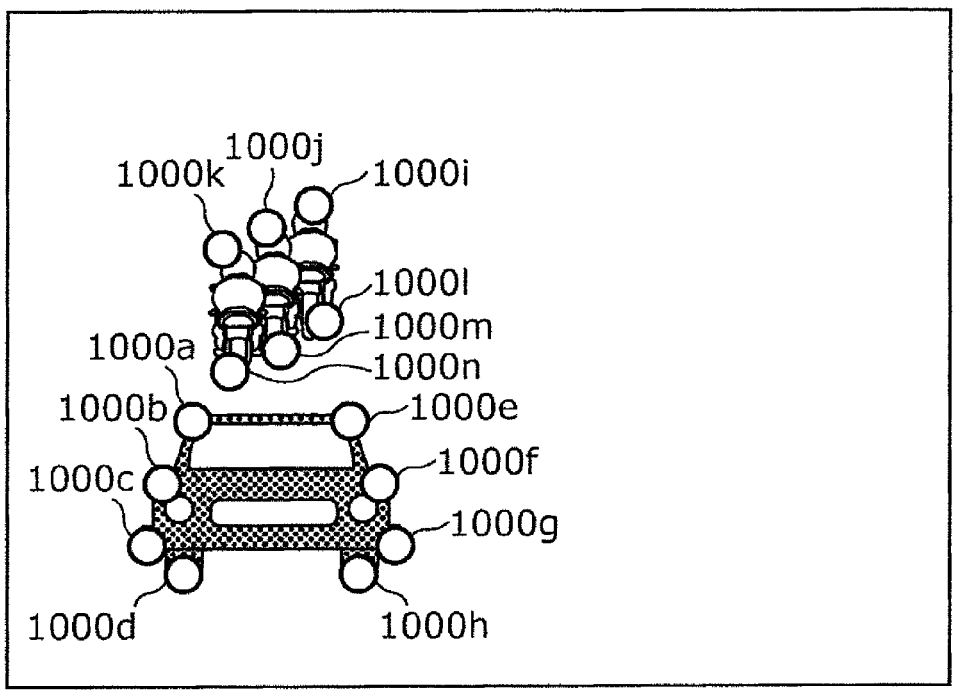
FIG. 10 is a conceptual diagram schematically illustrating a manner of extracting a feature value from a subject.

In the traveling control system 1, the motion vector is extracted for only a moving object having a power source and a living body capable of autonomously moving. This makes it possible to effectively monitor an object that can be a danger in the traveling of the vehicle, while reducing the amount of processing. Examples of moving objects having a power source are cars, motorcycles, trains, and bicycles. Examples of living bodies capable of autonomously moving are persons, and animals. FIG. 10 schematically illustrates a manner of extracting feature values 1000a to 1000n of subjects from a reference image.

The image processor 30 recognizes what the subjects are, from the extracted feature values (step S120).

The image processor 30 may have a table in which a definition of a relationship between a specific subject and its feature value is stored in advance, and the image processor 30 may recognize the subject based on the degree of similarity between the extracted feature value and feature values stored in the table. Hereinafter, a subject recognized in the above-described manner is referred to as a "first object". The image processor 30 stores the extracted feature value of the first object.

When a subject is recognized, the imaging device 20 acquires a multiple exposure image by performing a multiple exposure (step S130).

In the above description, it is assumed by way of example that the process in step S130 is performed after the processes from step S110 to step S120 are completed. However, the imaging device 20 and the image processor 30 can operate independently, and thus the processes from step S110 to step S120 can be executed in parallel to the process in step S130.

When the multiple exposure image is acquired, the image processor 30 extracts a first object in the multiple exposure image based on the stored feature value (step S140). More specifically, for example, the image processor 30 performs template matching using the stored feature value as a template thereby extracting the first object. The image processor 30 may identify a location, in the multiple exposure image, corresponding to the stored feature value.

When the first object is extracted from the multiple exposure image, the image processor 30 identifies the location of the first object in the multiple exposure image (step S150).

The image processor 30 then calculates a direction of movement, a velocity, and an acceleration of the first object from the identified location of the first object in the multiple exposure image (step S160).

A method of calculating the direction of movement, velocity, and the acceleration is described below.

Calculating Direction of Movement

A specific example of a method of calculating the direction of movement of the first object from the multiple exposure image is described below.

Locations of images of the first object corresponding to time points at intervals are identified from the multiple exposure image. Thus, if a time difference between each adjacent locations can be known, it is possible to calculate the direction of movement of the first object. In a short time period, the first object gradually moves away from the starting point of the movement. Therefore, when the location of the starting point is known, it can be estimated that the closer to the starting point, the older the location is, which makes it possible to calculate the direction of movement. In a case where a one-frame previous image is given as a reference image, the location of the first object in this reference image may be employed as a start point of the movement, and the direction of movement of the first object can be calculated from the multiple exposure image. In a case where a one-frame previous image is not a reference image but a multiple exposure image, an ending point of the first object in this one-frame previous multiple exposure image may be employed as a start point of the movement, and the direction of movement of the first object can be calculated from the current multiple exposure image.

Calculating Velocity

A specific example of a method of calculating the velocity of the first object from the multiple exposure image is described below.

Figure 11:
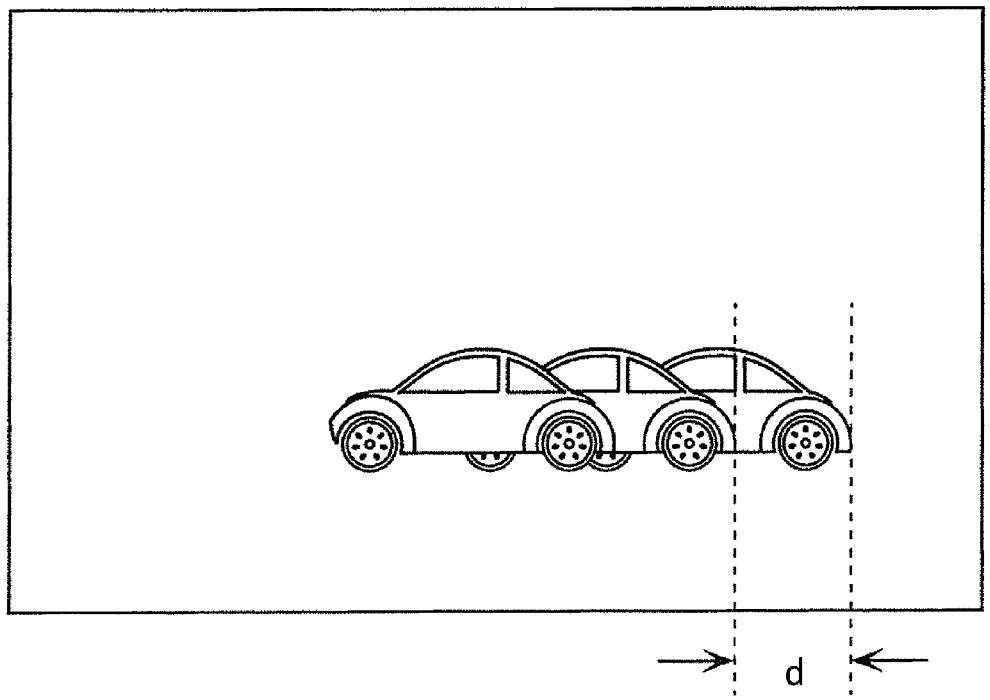
FIG. 11 is a diagram illustrating an example of a multiple exposure image.

FIG. 11 illustrates an example of a multiple exposure image acquired by performing exposure a plurality of times (three times in the specific example) at intervals of time t. In this multiple exposure image, the first object is a car.

As shown in FIG. 11, a displacement d of the location of the first object in the multiple exposure image is calculated. If the size of the first object in the actual space can be known, it is possible to determine the actual distance D of the movement of the first object in the actual space for a time 1. The time t corresponds to the exposure cycle t shown in FIGS. 6 and 8. The size of the first object in the actual space can be estimated with reference to a known size such as a number plate of a vehicle or the like whose size is specified by a standard. The size of the first object in the actual space may be roughly estimated from the type of the first object (such as a car, person, etc.). If the actual distance D can be known, then it is possible to calculate the velocity of the first object by dividing the actual distance D by time t.

In the above-described example of the method of calculating the velocity of the first object, the velocity is calculated based on the location of the first object captured in the first exposure in the plurality of exposures and the location of the first object captured in the second exposure in the plurality of exposures. However, it is possible to calculate the velocity of the first object based on locations of the first object captured by arbitrary two exposures. Furthermore, the velocity may be calculated based on locations of the first object obtained by combinations each including two arbitrary two exposures in a plurality of exposures, and an average value thereof may be employed as the velocity of the first object.

Note that the value of the velocity obtained via the calculation described above is a relative velocity of the first object with reference to the imaging device 20 in a case where the imaging device 20 is moving. In a case where the imaging device 20 is at rest, the calculated value indicates the absolute velocity of the first object.

Calculating Acceleration

A specific example of a method of calculating the acceleration of the second object from the multiple exposure image is described below.

As described above, a velocity may be calculated based on locations of the first object obtained by an arbitrary set of two exposures in a plurality of exposures in a multiple exposure image. This method may be used to calculate velocity of the first object for two different periods. Furthermore, the acceleration of the first object may be calculated from the difference in velocity between the two difference periods.

Referring again to FIG. 9, the first moving object detection process is further described below.

When the process in step S160 is completed, the camera system 10 determines whether to end the moving object detection mode (step S170).

For example, in a case where the camera system 10 accepts an operation performed by a user of the camera system 10 to set the operation mode of the camera system 10 to a mode other than the moving object detection mode, the camera system 10 may determine that the moving object detection mode is to be ended. On the other hand, for example, in a case where the camera system 10 receives, from the electronic control unit 80, a signal indicating that the engine has stopped, the camera system 10 may determine that the moving object detection mode is to be ended.

In a case where it is determined in the process in step S170 that the moving object detection mode is not to be ended (No in step S170), the control circuit 40 determines whether to perform a normal exposure or a multiple exposure in a next frame period (step S180).

Next, a method of determining whether to perform a normal exposure or a multiple exposure in a next frame period is determined below.

Determining Exposure Mode in Next Frame Period

Once a feature value of a first object is extracted from a reference image, this feature value can be used repeatedly in identifying locations of the first object in a following multiple exposure image.

However, in a case where the first object disappears from the following multiple exposure image or in a case where a new object (hereinafter referred to as a "second object") different from the first object appears, it is necessary to newly extract a feature value from the reference image.

Therefore, the control circuit 40 determines, based on the multiple exposure image, whether the imaging device 20 is to perform a normal exposure or a multiple exposure in a next frame period. More specifically, for example, in a case where the first object is not detected in the multiple exposure image, or in a case where a second object is detected in the multiple exposure image, the control circuit 40 determines that the normal exposure is to be performed in the next frame period. However, in any other cases, the control circuit 40 determines that the multiple exposure is to be performed in the next frame period.

The first object may disappear from the multiple exposure image, for example, in one of the following cases: a case in which the first object moves to the outside of the imaging area of the imaging device 20; a case in which a change in view of the first object occurs due to a change in the direction or the angle of the first object; a case in which another object overlaps the first object and thus the first object is hidden behind the object located closer to the imaging device 20 than the location of the object; etc.

An occurrence of disappearance of the first object may be detected, for example, by checking whether the number of images of the first object detected on the multiple exposure image is smaller than the number of exposures performed in the image capturing operation in the multiple exposure mode.

Figure 12:
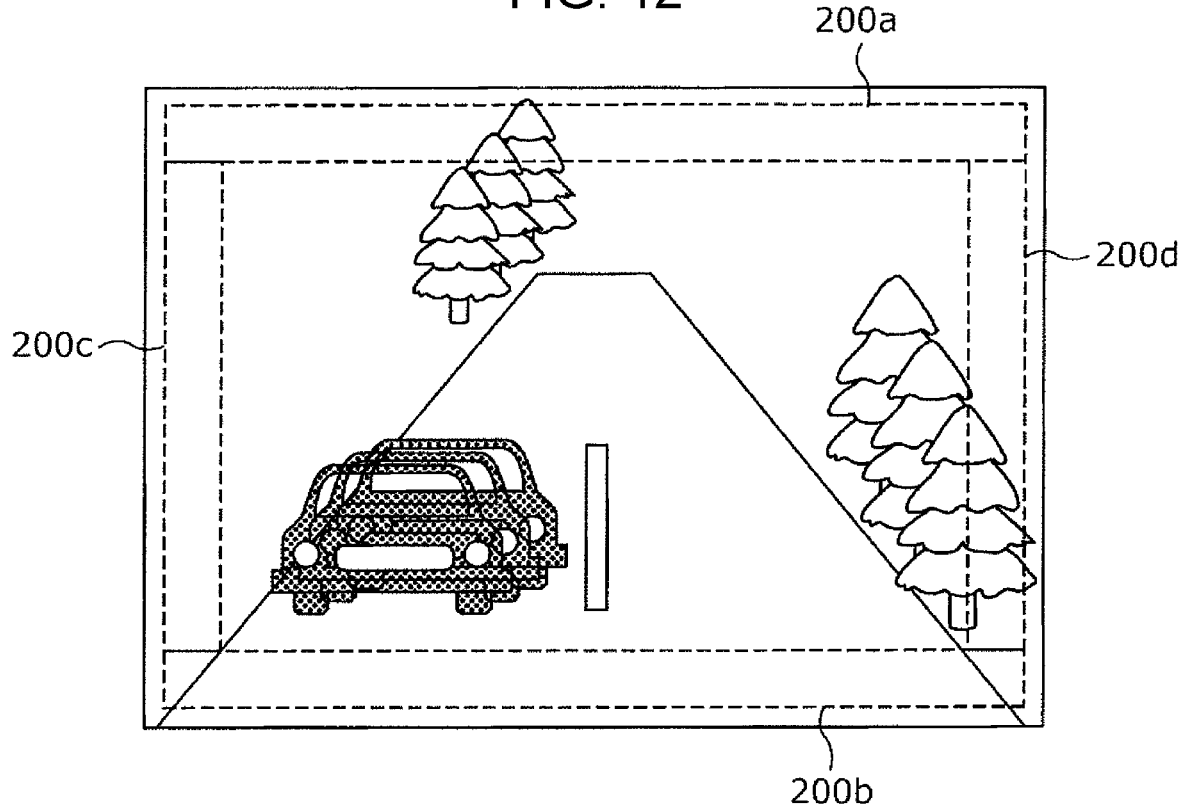
FIG. 12 is a diagram illustrating an example of a multiple exposure image.

FIG. 12 illustrates an example of a multiple exposure image.

As can be seen from FIG. 12, a second object may enter the imaging area of the imaging device 20 through an upper edge area 200*a*, a lower edge area 200*b*, a left edge area 200*c*, or a right edge area 200*d*. Thus, in pixel regions corresponding to the areas described above, nondestructive reading may be performed in each period between adjacent exposures in a multiple exposure. This makes it possible to detect entering of a second object into the imaging area of the imaging device 20. Hereinafter, the area for detecting the entering of the second object will also be referred to as a "moving object detection area".

Figure 13:
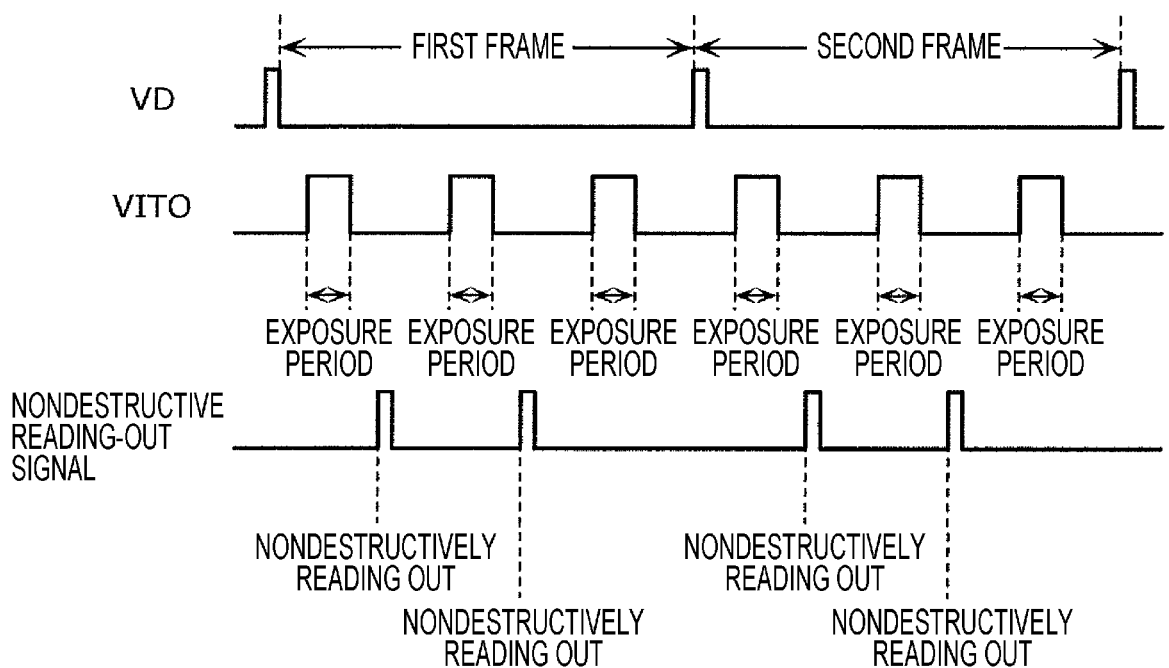
FIG. 13 is a diagram illustrating operation timing in nondestructive reading of a charge by an imaging device according to the first embodiment.

FIG. 13 illustrates operation timing in nondestructively reading of an amount of charge accumulated in FD 22 from a pixel 101 in a moving object detection area. Note that it is assumed here that each pixel 101 of the imaging device 20 includes a photoelectric conversion element using a photoelectric conversion film.

In FIG. 13, a graph of a nondestructive reading signal illustrates timings of pulse signals that cause it to start nondestructively reading out an amount of charge accumulated in the FD 22 from pixels 101. In synchronization with timing of rising of the nondestructive reading signal from the low level to the high level, the charge accumulated in the FD 22 is nondestructively read out.

As described above, by performing nondestructive reading between each adjacent exposures in a multiple exposure, it is possible to detect a change in location of an object entering imaging area of the imaging device 20, and thus it is possible to easily detect the object in a multiple exposure image. Although there is no particular restriction on the size of the moving object detection area, it is desirable to determine the size of the moving object detection area such that a good balance is achieved between the amount of processing and the size of the object.

In the example described above with reference to the drawings, it is assumed by way of example that the nondestructive reading is performed in each period between adjacent exposures in a multiple exposure. However, the nondestructive reading may be performed only once in a period between particular adjacent exposures.

Figure 14:
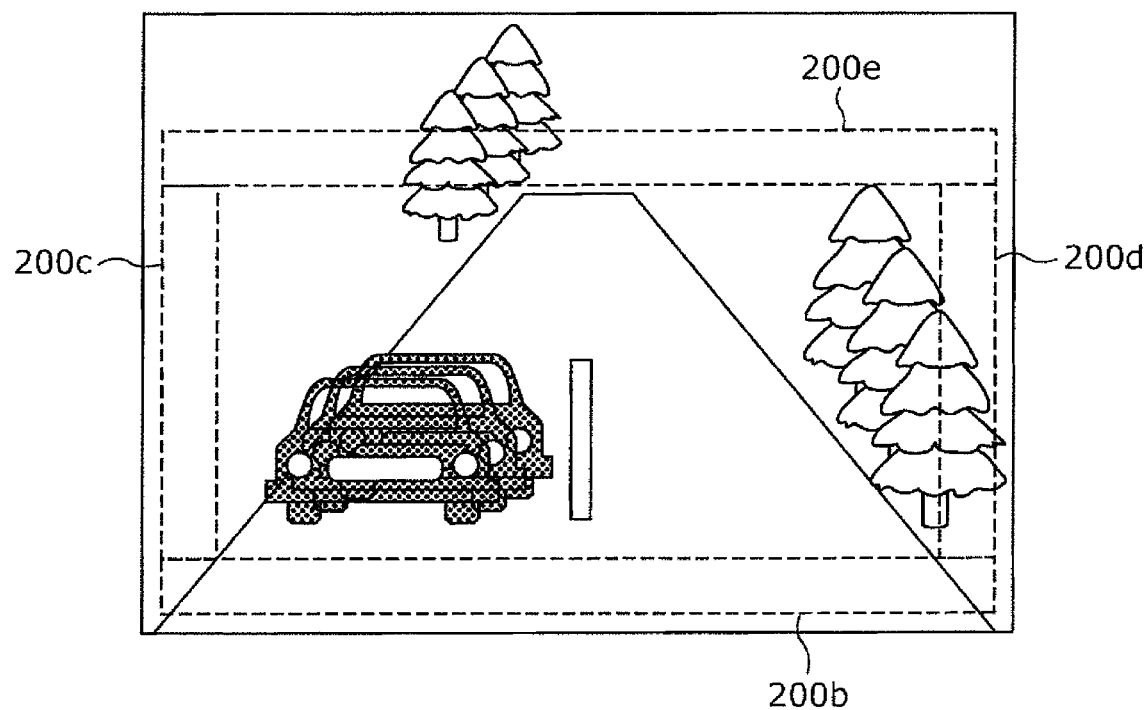
FIG. 14 illustrates an example of a multiple exposure image.

In a case where the imaging device 20 is installed on a vehicle, the upper region above the imaging area of the imaging device 20 is the sky. In such a case, the upper edge area 200e in the moving object detection area may be set to be located closer to the center of the imaging area as shown in FIG. 14.

The moving object detection area is not limited to a fixed area, but the moving object detection area may be variable.

Referring again to FIG. 9, the first moving object detection process is further described below.

In a case where it is determined in the process in step S180 that a normal exposure is to be performed in a next frame period, the camera system 10 returns to the process in step S100 (Yes in step S190). In this case, the process is repeated from step S100.

In a case where it is not determined in the process in step S180 that a normal exposure is to be performed in a next frame period, that is, in a case where it is determined that a multiple exposure is to be performed, the camera system 10 returns to the process in step 130 (No in step S190). In this case, the process is repeated from step S130.

In a case where it is determined in the process in step S170 that the moving object detection mode is to be ended (Yes in step S170), the camera system 10 ends the first moving object detection process.

1.3 Supplementary Remarks

The camera system 10 is capable of detecting a relative direction of movement of a first object by tracking a change in the location of the first object in a multiple exposure image. In a case where the actual size of the first object, the focal length of the optical system 50, and the exposure cycle in the multiple exposure are known, it is possible to calculate the relative velocity, the relative acceleration, and/or the like of the first object.

As described above, the camera system 10 extracts a feature value of the first object from a first image which is not a multiple exposure image. Using the extracted feature value, the first object is extracted from the multiple exposure image. Thus, it is possible to reduce a probability that the camera system 10 erroneously detects the shape, the number, and/or the like of the first object.

Thus, it becomes possible for the camera system 10 to accurately and precisely identify the location of the first object in the multiple exposure image.

Second Embodiment 2.1 Overview

A camera system according to a second embodiment is described below.

In the first embodiment described above, a multiple exposure image is acquired after a reference image is acquired.

In the second embodiment, unlike the first embodiment, after a reference image is acquired, it is determined, based on the acquired reference image, whether a reference image or a multiple exposure image is acquired next.

2.2 Configuration

In the second embodiment, the camera system may be similar in configuration to the camera system 10 according to the first embodiment, and thus a description of the constituent elements is omitted.

2.3 Operation

In the camera system according to the second embodiment, a second moving object detection process is performed instead of the first moving object detection process according to the first embodiment.

The second moving object detection process is described below with reference to drawings.

Figure 15:
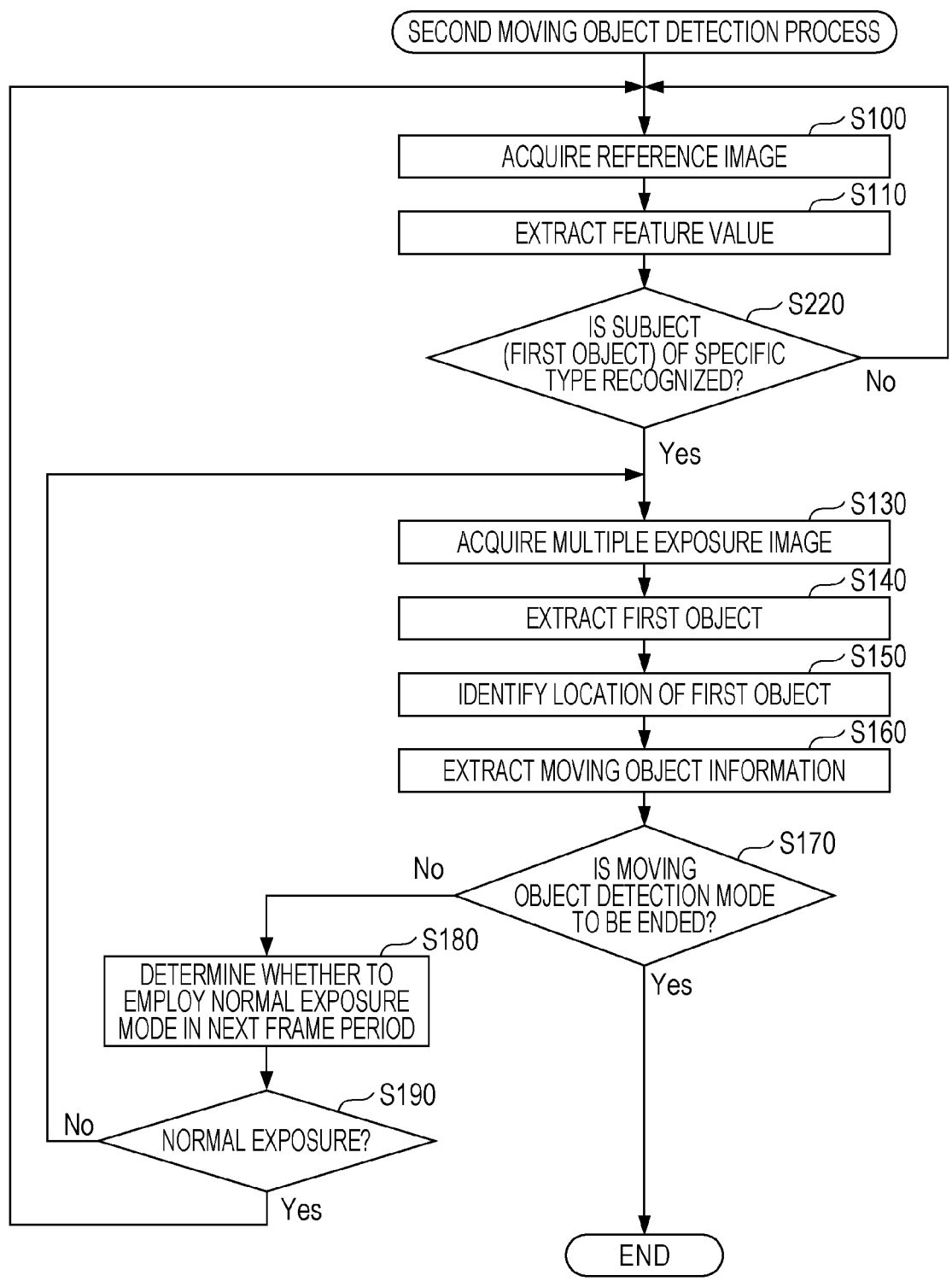
FIG. 15 is a flow chart illustrating a second moving object detection process.

FIG. 15 is a flow chart illustrating the second moving object detection process.

As shown in FIG. 15, the second moving object detection process is different from the first moving object detection process according to the first embodiment in that the process in step S120 is replaced by a process in step S220.

The following explanation focuses on the process in step S220 and related processes.

When a feature value of a specific subject is extracted from a reference image in the process in step S110, the image processor 30 tries to recognize what the specific subject on the reference image is, based on the extracted feature value of the specific subject (step S220).

In a case where the specific subject is recognized in the process in step S220 (Yes in step S220), the processing flow proceeds to the process in step S130 to acquire a multiple exposure image.

In a case where the specific subject cannot be recognized in the process in step S220 (No in step S220), the processing flow proceeds to the process in step S100 to acquire a reference image.

2.4 Supplementary Remarks

In the camera system according to the second embodiment, the reference image acquisition process is repeated until a specific subject is recognized from a reference image in the process in step S220, that is, until an object that can be a danger in the traveling of the vehicle is recognized. A multiple exposure image is acquired only when a specific subject is recognized from a reference image in the process in step S220.

In the camera system according to the second embodiment, as described above, in a case where an object that can be a danger in traveling of the vehicle is not detected from a reference image, the multiple exposure image acquisition is not performed.

Thus, the camera system according to the second embodiment is capable of effectively monitoring an object that can be a danger in traveling of a vehicle while reducing the amount of processing for detecting a moving object.

Third Embodiment 3.1 Overview

A camera system according to a third embodiment is described below.

In the first embodiment described above, each time a multiple exposure image is acquired, a determination is made as to whether to acquire a reference image or a multiple exposure image in a next frame period, and a next image is acquired according to a determination result.

In contrast, in the third embodiment, after a reference image is acquired once, a multiple exposure image is acquired successively a predetermined number of times. Furthermore, the acquisition of the reference image and the acquisition of the multiple exposure image are performed alternately.

3.2 Configuration

In the third embodiment, the camera system may be similar in configuration to the camera system 10 according to the first embodiment, and thus a description of the constituent elements is omitted.

3.3 Operation

In the camera system according to the third embodiment, a third moving object detection process is performed instead of the first moving object detection process according to the first embodiment.

The third moving object detection process is described below with reference to drawings.

Figure 16:
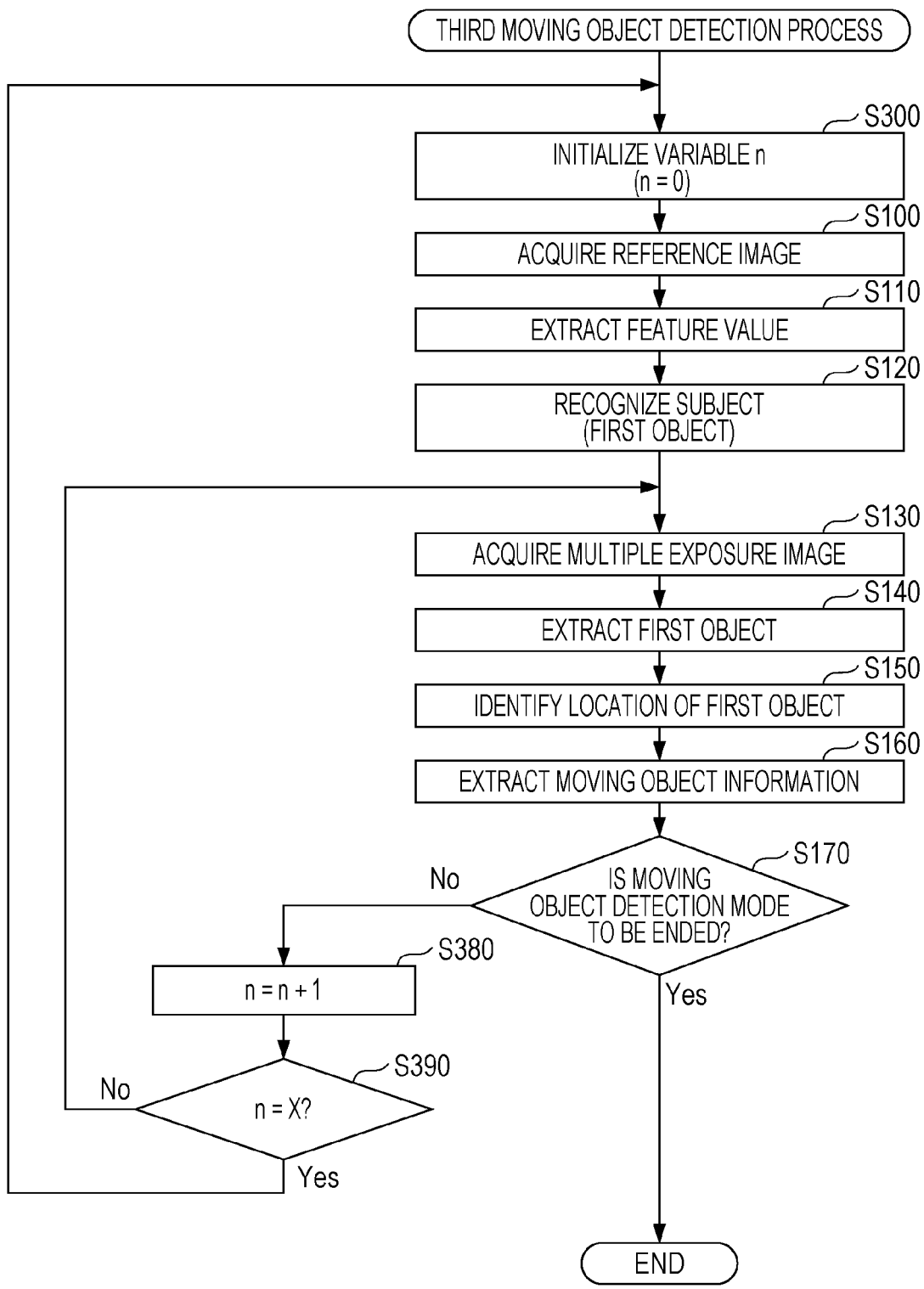
FIG. 16 is a flow chart illustrating a third moving object detection process.

FIG. 16 is a flow chart illustrating the third moving object detection process.

As shown in FIG. 16, the third moving object detection process is different from the first moving object detection process according to the first embodiment in that a process in step S300 is added before the process in step S100, the process in step S180 is replaced by a process in step S380, and the process in step S190 is replaced by a process in step S390.

The following explanation is given while focusing on the process in step S300, the process in step S380, the process in step S390, and related processes.

As shown in FIG. 16, when the third moving object detection process starts, the control circuit 40 initializes an integer type variable n (step S300). Herein, the initialization of the variable n is achieved by substituting 0 into the variable n.

After the variable n is initialized, the processing flow proceeds to a process in step S100 to acquire a reference image.

In a case where it is determined in the process in step S170 that the moving object detection mode is not to be ended (No in step S170), the control circuit 40 substitutes n+1 into the variable n (step S380).

The control circuit 40 checks whether the new substituted value of the variable n is equal to a preset integer X greater than or equal to 1 (step S390). That is, the control circuit 40 the number of times the multiple exposure image has been successively acquired has reached the preset value X.

The value X may be set, for example, depending on the traveling speed of the vehicle on which the imaging device 20 is installed. The value X may be set depending on a type of a road on which the vehicle, on which the imaging device 20 is installed, travels. The value X may be set depending on weather around the vehicle on which the imaging device 20 is installed. Examples of types of roads are a highway, an ordinal road, etc. Examples of weather are fine weather, rainy weather, etc.

In a case where it is determined in the process in step S390 that a new value substituted into the variable n is equal to the integer X (Yes in step S390), the processing flow proceeds to step S100 to repeat the process from step S300. That is, the variable n is initialized (step S300), and a reference image is captured (step S100). Note that when the new value substituted into the variable n is equal to the integer X, the number of times the multiple exposure image has been successively acquired reaches the preset particular value X.

In a case where it is determined in the process in step S390 that the new value substituted into the variable n is not equal to the integer X (No in step S390), the processing flow proceeds to step S130 to repeat the process from step S130. That is, the successive acquisition of the multiple exposure image is further continued. Note that when the new value substituted into the variable n is not equal to the integer X, the number of times the multiple exposure image has been successively acquired has not yet reached the preset particular value X.

3.4 Supplementary Remarks

In the first embodiment described above, each time a multiple exposure image is acquired, a determination is made as to whether to perform a normal exposure or a multiple exposure in a next frame period.

In contrast, in the third embodiment, the determination as to whether to perform a normal exposure or a multiple exposure in a next frame period is not made each time a multiple exposure image is acquired.

Thus, in the camera system according to the third embodiment, it is possible to further reduce the amount of processing in detecting a moving object to a level smaller than is achieved in the camera system according to the first embodiment.

As described above, in the camera system according to the third embodiment, after a reference image is acquired once, a multiple exposure image is acquired successively a preset particular number of times. Furthermore, in the camera system according to the third embodiment, the process described above is performed repeatedly.

Thus, in the camera system according to the third embodiment, a reference image is acquired periodically.

Let it be assumed by way of example that a problem occurs in a mechanism for determining whether to acquire a reference image or a multiple exposure image, or an error occurs in the determination. In such a case, there is a possibility that a multiple exposure image is acquired in a situation in which a reference image should be acquired. If such an error occurs, a reference image is not acquired for a certain period, which may make it difficult to properly extract an object from the multiple exposure image.

In contrast, in the camera system according to the third embodiment, it is possible to prevent an occurrence of a situation in which a reference image is not acquired over a certain period.

Fourth Embodiment 4.1 Overview

A camera system according to a fourth embodiment is described below.

In the first embodiment described above, a feature value of a subject is extracted from a reference image acquired by a normal exposure.

In contrast, in the fourth embodiment, a feature value is extracted from an image obtained by first N exposures in a multiple exposure. N is an integer set to a value greater than 1 and smaller than the number of exposures performed in acquiring a multiple exposure image.

4.2 Configuration

The camera system according to the fourth embodiment may be similar in configuration to the camera system 10 according to the first embodiment, and thus a description of the constituent elements is omitted.

4.3 Operation

In the camera system according to the fourth embodiment, a fourth moving object detection process is performed instead of the first moving object detection process according to the first embodiment.

The fourth moving object detection process is described below with reference to drawings.

Figure 17:
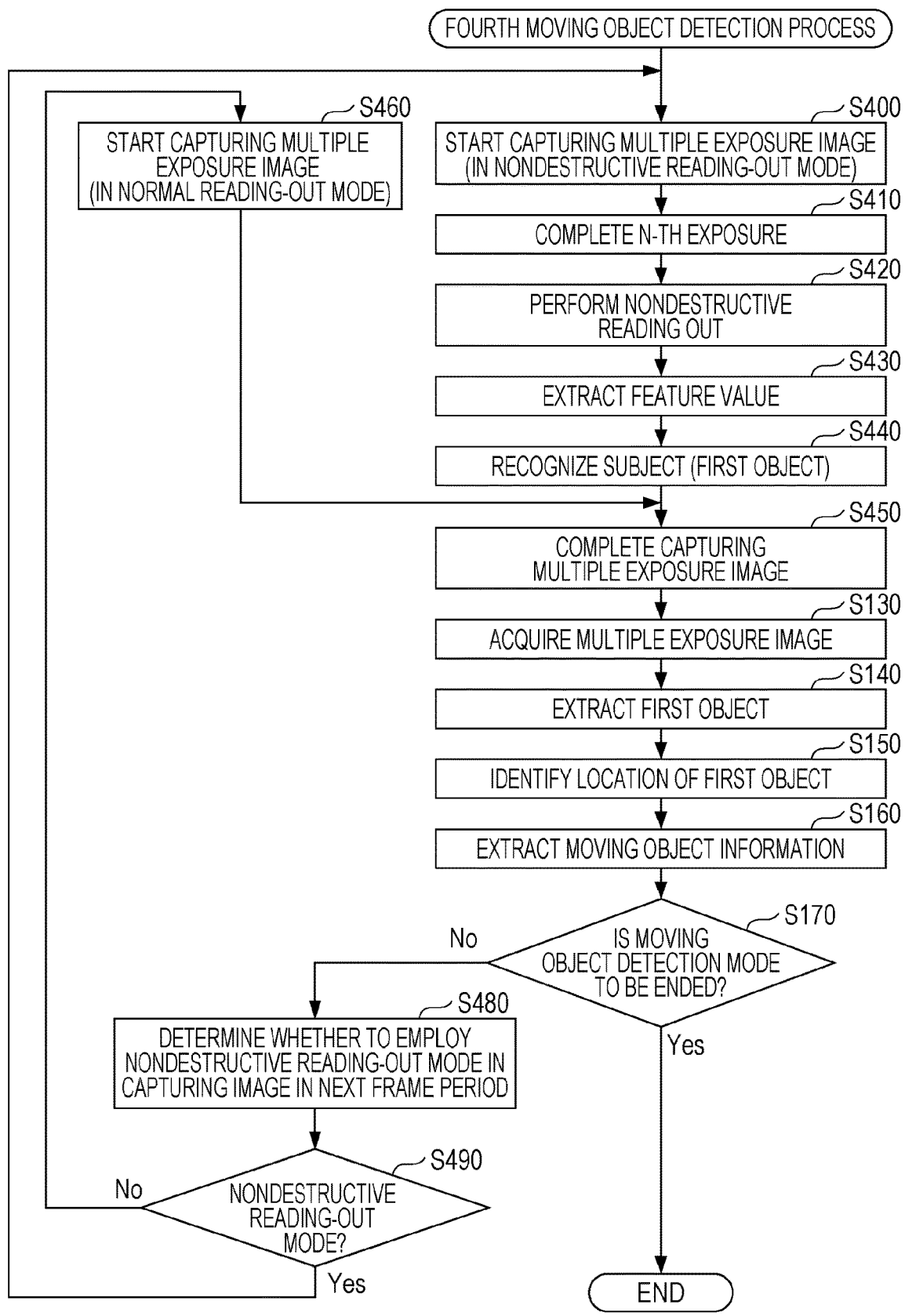
FIG. 17 is a flow chart illustrating a fourth moving object detection process.

FIG. 17 is a flow chart illustrating a fourth moving object detection process.

As shown in FIG. 17, the fourth moving object detection process is different from the first moving object detection process according to the first embodiment in that the process from step S100 to step S120 is removed, a process from step S400 to step S460 is added, the process in step S180 is replaced by a process in step S480, and the process in step S190 is replaced by a process in step S490.

Thus, the following explanation focuses on the process from step S400 to step S460, the process in step S480, the process in step S490, and related processes.

As shown in FIG. 17, when the fourth moving object detection process starts, the imaging device 20 starts capturing a multiple exposure image by performing a multiple exposure (step S400). At a point of time when an N-th exposure in a multiple exposure is ended, a pixel value is nondestructively read out from each pixel 101 (steps S410, S420). Thus, an image is acquired by as many N exposures. Hereinafter, this image is referred to as a "nondestructive image". Although the value of N is not limited to 1, it is desirable that N=1.

In the following description, a "nondestructive reading mode" denotes an operation mode in which a nondestructive image is acquired at a point of time when an N-th exposure in a multiple exposure is ended, while a "normal reading mode" denotes an operation mode in which a nondestructive image is not acquired in the middle of a multiple exposure. When the operation modes are defined in the above-described manner, the process in step S400 is a process in which capturing a multiple exposure image in the nondestructive reading mode is started.

Figure 18:
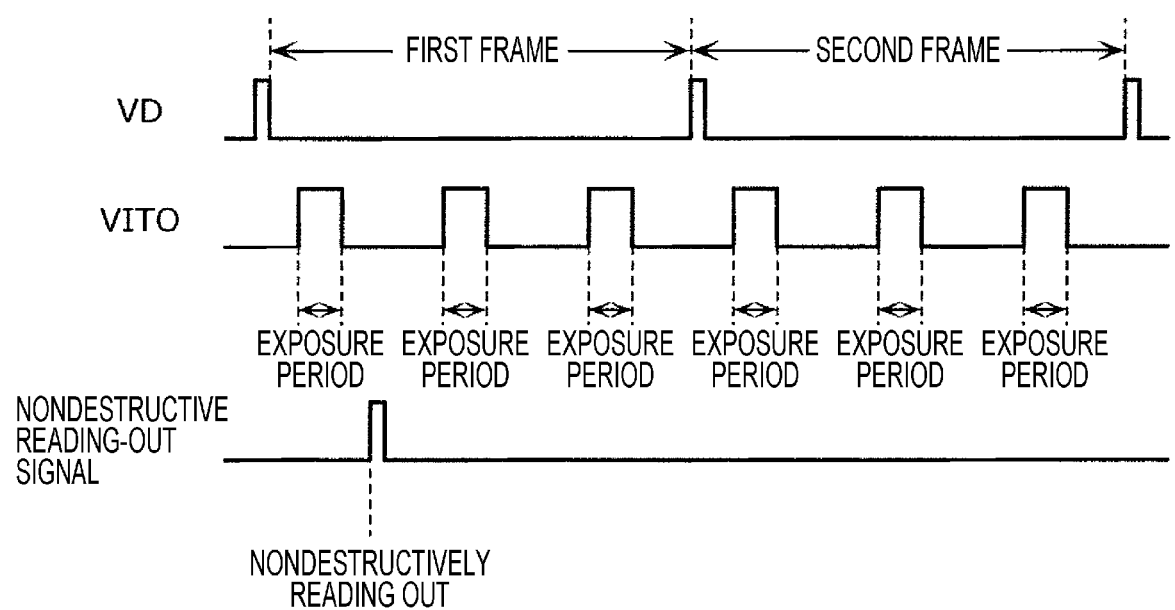
FIG. 18 is a diagram illustrating an example of operation timing in a multiple exposure in two frame periods in an imaging device according to a fourth embodiment.

FIG. 18 illustrates an example of operation timing of a multiple exposure in two frame periods. Note that in this example, it is assumed that each pixel 101 of the imaging device 20 includes a photoelectric conversion element using a photoelectric conversion film.

In FIG. 18, a graph of a nondestructive reading signal represents a change in a pulse signal that controls the timing of nondestructive reading.

The nondestructive reading signal rises up at a point of time when an N-th exposure is ended in a frame period in which the nondestructive reading mode is employed as the operation mode. In the specific example shown in FIG. 18, the multiple exposure is performed 3 times and N=1.

The imaging device 20 acquires a nondestructive image at a point of time when the nondestructive reading signal rises up. Thus, the imaging device 20 acquires a nondestructive image and a multiple exposure image in the first frame period. Furthermore, in the second frame period, the imaging device 20 acquires only a multiple exposure image without acquiring a nondestructive image.

Referring again to FIG. 17, the fourth moving object detection process is further described below.

When the nondestructive image is acquired, the image processor 30 extracts a feature value of each of all subjects from the acquired nondestructive image (step S430). Based on each extracted feature value, the recognition is performed to identify what each subject is (step S440). When the acquisition of the multiple exposure image is ended (step S450), the processing flow proceeds to step S130 to perform the process in step S130 and processes in following steps.

In a case where it is determined in the process in step S170 that the moving object detection mode is not to be ended (No in step S170), the control circuit 40 determines whether to acquire a multiple exposure image in the nondestructive reading mode or in the normal reading mode in a next frame period (step S480).

The determination as to whether to acquire a multiple exposure image in the nondestructive reading mode or in the normal reading mode in a next frame period may be made in a similar manner to that employed in step S180 in the first moving object detection process according to the first embodiment. More specifically, in the explanation on the process in step S180, "a normal exposure is performed" is read as "a multiple exposure image is acquired in the nondestructive reading mode, and "a multiple exposure is performed" is read as "a multiple exposure image is acquired in the normal reading mode". A further detailed description thereof is omitted.

In a case where it is determined in the process in step S480 that a multiple exposure image is to be acquired in the nondestructive reading mode in the next frame period (Yes in step S490), the processing flow returns to step S400 to repeat the process from step S400.

In a case where in the process in step S480, it is not determined that a multiple exposure image is to be acquired in the nondestructive reading mode in the next frame period, that is, in a case where it is determined that a multiple exposure image is acquired in the normal reading mode in the next frame period (No in step S490), acquiring the multiple exposure image in the normal reading mode is started (step S460). When the acquisition of the multiple exposure image is ended (step S450), the processing flow proceeds to step S130 to perform the process in step S130 and processes in following steps.

4.4 Supplemental Remarks

The camera system according to the fourth embodiment extracts a feature value from a nondestructive image acquired in the nondestructive reading mode.

Thus, the camera system according to the fourth embodiment, is capable of accurately identifying a location of a subject in a multiple exposure image without providing an additional frame period in which a normal exposure is performed. Furthermore, it is not necessary to provide a frame period in which a reference image is acquired, and thus it is allowed to successively acquire multiple exposure images and thus it is possible to continuously detect a moving object.

Fifth Embodiment 5.1 Overview

A camera system according to a fifth embodiment is described below.

In the first embodiment described above, the sensitivity is maintained constant over all different exposure periods when a multiple exposure image is acquired.

In contrast, in the fifth embodiment, the sensitivity is varied depending on exposure periods in a multiple exposure operation.

5.2 Configuration

The camera system according to the fifth embodiment may be similar in configuration to the camera system 10 according to the first embodiment, and thus a description of the constituent elements is omitted.

5.3 Operation

In the camera system according to the fifth embodiment, a five moving object detection process is performed instead of the first moving object detection process according to the first embodiment.

The five moving object detection process is described below with reference to drawings.

The five moving object detection process is different from the first moving object detection process according to the first embodiment in that a sensitivity of each exposure in a multiple exposure for acquiring a multiple exposure image is set to either one of two different sensitivities. The flow chart illustrating the five moving object detection process is the same as the flow chart of the first moving object detection process according to the first embodiment, and thus a description of each step is omitted.

Figure 19A:
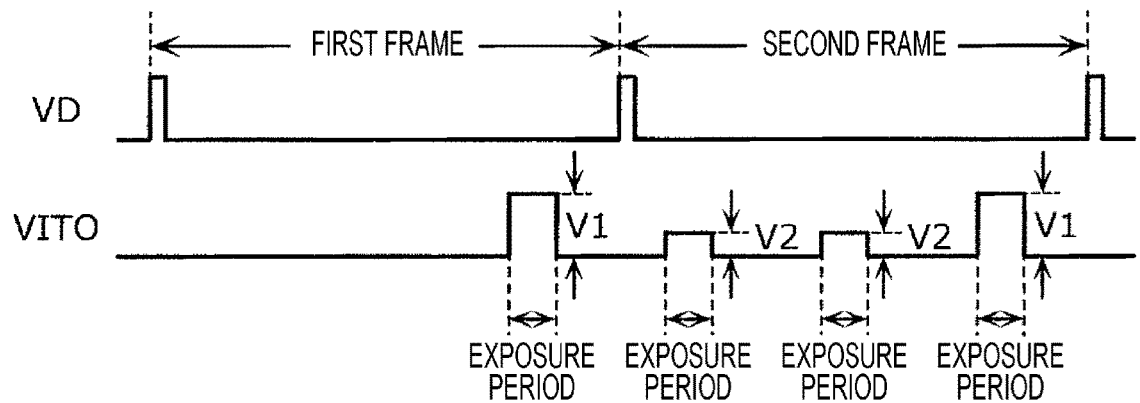
FIG. 19A is a diagram illustrating an example of operation timing in a normal exposure and a multiple exposure in two frame periods in an imaging device according to a fifth embodiment.
Figure 19B:
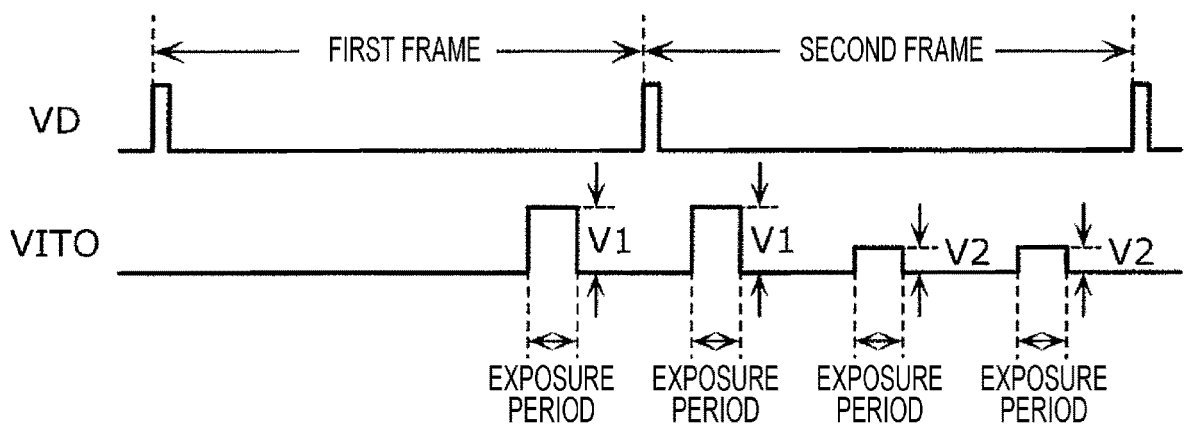
FIG. 19B is a diagram illustrating an example of operation timing in a normal exposure and a multiple exposure in two frame periods in an imaging device according to the fifth embodiment.
Figure 19C:
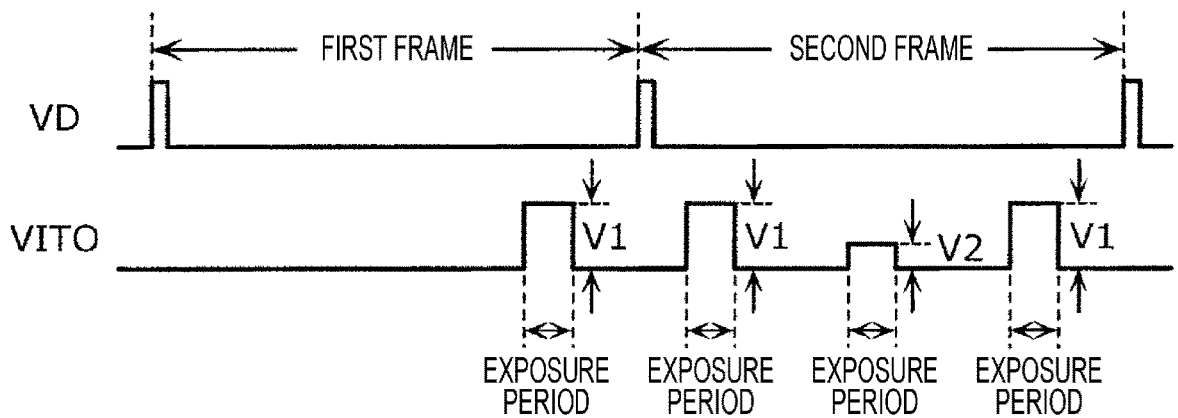
FIG. 19C is a diagram illustrating an example of operation timing in a normal exposure and a multiple exposure in two frame periods in an imaging device according to the fifth embodiment.

FIGS. 19A to 19C each illustrate an example of operation timing in a normal exposure and a multiple exposure in two frame periods. Note that it is assumed here that each pixel

101 of the imaging device 20 includes a photoelectric conversion element using a photoelectric conversion film. In FIGS. 19A to 19C, a normal exposure is performed in a first frame period while a multiple exposure is performed in a second frame period.

As shown in FIGS. 19A to 19C, during the second frame period in which a multiple exposure is performed, the voltage applied to the transparent electrode 110A is set to either V1 or V2 except when the voltage is at the low level, where V1 is equal to the high level and V2 is lower than V1 and higher than the low level.

As described above, when the bias voltage applied to the photoelectric conversion layer 110C is relatively high, the photoelectric conversion efficiency is relatively high, while when the bias voltage applied to the photoelectric conversion layer 110C is relatively low, the photoelectric conversion efficiency is relatively low. Therefore, in a period in which the voltage applied to the transparent electrode 110A is V1, the sensitivity is higher than in a period in which the voltage applied to the transparent electrode 110A is V2.

5.4 Supplementary Remarks

The camera system according to the fifth embodiment is capable of changing the luminance of images such that the luminance of an image of a subject acquired by a specific exposure in a multiple exposure is different from luminance of images of the same subject.

For example, as shown in FIG. 19A, the voltage applied to the transparent electrode 110A is set to V1 only during a last exposure period in a multiple exposure, while the voltage applied to the transparent electrode 110A is set to V2 during the other exposure periods. This makes it possible to obtain higher luminance for an image of a subject acquired by a last exposure than for the other images of the same subject in a multiple exposure image. Thus, it becomes possible to relatively easily identify the image of the subject acquired by the last exposure in the multiple exposure image.

For example, as shown in FIG. 19B, the voltage applied to the transparent electrode 110A is set to V1 only during a first exposure period in a multiple exposure, while the voltage applied to the transparent electrode 110A is set to V2 during the other exposure periods. This makes it possible to obtain higher luminance for an image of a subject acquired by a first exposure than for the other images of the same subject in a multiple exposure image. Thus, it becomes possible to relatively easily identify the image of the subject acquired by the first exposure in the multiple exposure image.

For example, as shown in FIG. 19C, the voltage applied to the transparent electrode 110A is set to V1 only during a first exposure period and a last exposure period in a multiple exposure, while the voltage applied to the transparent electrode 110A is set to V2 during the other exposure periods. This makes it possible to obtain higher luminance for images of a subject acquired by a first exposure and a last exposure than for the other images of the same subject in a multiple exposure image. Thus, it becomes possible to relatively easily identify the images of the subject acquired by the first exposure and the last exposure in the multiple exposure image.

In any example described above, the camera system according to the fifth embodiment is capable of more easily calculating a direction of movement of the subject than is possible by the camera system according to the first embodiment.

Sixth Embodiment 6.1 Overview

A camera system according to a sixth embodiment is described below.

In the fifth embodiment described above, when a multiple exposure image is acquired, the sensitivity in each exposure is allowed to be set to one of two values.

In contrast, in the sixth embodiment, when a multiple exposure image is acquired, the sensitivity in each exposure is allowed to be set to one of three or more values.

6.2 Configuration

The camera system according to the sixth embodiment may be similar in configuration to the camera system 10 according to the first embodiment, and thus a description of the constituent elements is omitted.

6.3 Operation

In the camera system according to the sixth embodiment, a sixth moving object detection process is performed instead of the five moving object detection process according to the fifth embodiment.

The sixth moving object detection process is described below with reference to drawings.

The sixth moving object detection process is different from the first moving object detection process according to the first embodiment in that when a multiple exposure image is acquired, the sensitivity in each exposure is set to one of three different values. The flow chart illustrating the sixth moving object detection process is the same as the flow chart of the first moving object detection process according to the first embodiment, and thus a description of each step is omitted.

Figure 20A:
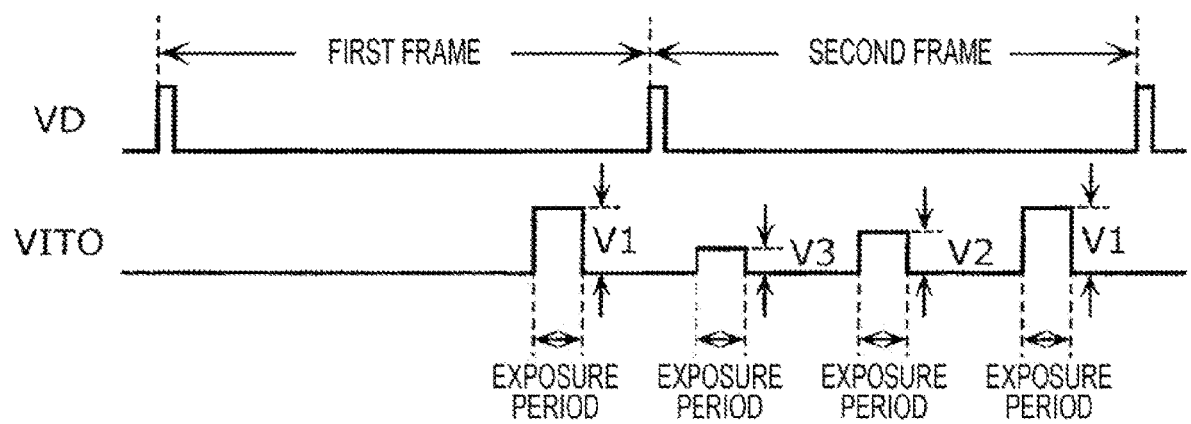
FIG. 20A is a diagram illustrating an example of operation timing in a normal exposure and a multiple exposure in two frame periods in an imaging device according to a sixth embodiment.
Figure 20B:
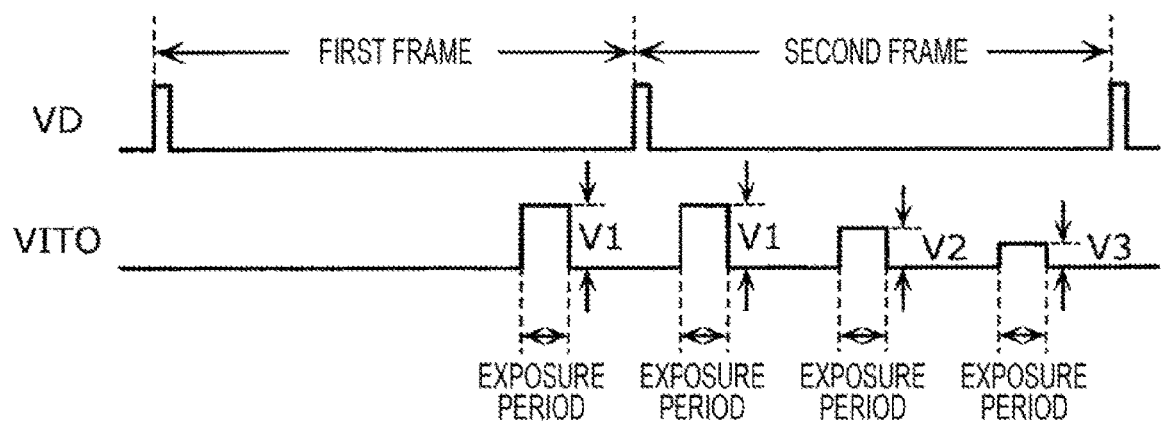
FIG. 20B is a diagram illustrating an example of operation timing of a normal exposure and a multiple exposure in two frame periods in an imaging device according to the sixth embodiment.

FIGS. 20A and 20B each illustrate an example of operation timing of a normal exposure and a multiple exposure in two frame periods. Note that it is assumed here that each pixel 101 of the imaging device 20 includes a photoelectric conversion element using a photoelectric conversion film. In FIGS. 20A and 20B, a normal exposure is performed in a first frame period and a multiple exposure is performed in a second frame period.

As shown in FIGS. 20A and 20B, during the second frame period in which a multiple exposure is performed, the voltage applied to the transparent electrode 110A is set to one of three voltages V1, V2, and V3 except when the voltage is at the low level, where V1 is equal to the high level, V2 is lower than V1 and higher than V2, and V3 is lower than V2 and higher than the low voltage. In a period in which the voltage applied to the transparent electrode 110A is V1, the sensitivity is higher than in a period in which the voltage applied to the transparent electrode 110A is V2, while in a period in which the voltage applied to the transparent electrode 110A is V2, the sensitivity is higher than in a period in which the voltage applied to the transparent electrode 110A is V3.

In the following explanation of the sixth embodiment, it is assumed by way of example that the voltage applied to the transparent electrode 110A is set to one of three values V1, V2, and V3, although the voltage applied to the transparent electrode 110A may be set to one of four or more values.

6.4 Supplementary Remarks

The camera system according to the sixth embodiment is capable of changing the luminance among a plurality of images acquired for the same subject in a multiple exposure image.

For example, as shown in FIG. 20A, when a multiple exposure image is acquired, the voltage applied to the transparent electrode 110A in each exposure may be varied such that the later the exposure period the higher the applied voltage. This makes it possible to obtain luminance for the images of the same subject acquired in the multiple exposure image such that the later the image the higher the luminance. Thus, it becomes possible to relatively easily identify the time sequential order of the images of the same subject acquired in the multiple exposure image. Thus, it becomes possible to more easily calculate the direction of movement of the subject than in the case where the sensitivity is not changed among exposures when a multiple exposure image is acquired.

For example, as shown in FIG. 20B, when a multiple exposure image is acquired, the voltage applied to the transparent electrode 110A in each exposure may be varied such that the later the exposure the lower the voltage. This makes it possible to obtain luminance for the images of the same subject acquired in the multiple exposure image such that the later the image the lower the luminance. Thus, it becomes possible to relatively easily identify the time sequential order of the images of the same subject acquired in the multiple exposure image. Thus, it becomes possible to more easily calculate the direction of movement of the subject than in the case where the sensitivity is not changed among exposures when a multiple exposure image is acquired.

Seventh Embodiment 7.1 Overview

A camera system according to a seventh embodiment is described below.

In the first embodiment described above, when a multiple exposure image is acquired, an exposure period and a non-exposure period are provided alternately and an exposure is performed a plurality of times.

For example, in a case where each pixel 101 of the imaging device 20 is configured to include a photoelectric conversion element using a photoelectric conversion film, each non-exposure period is a period in which the voltage VITO applied to the transparent electrode 110A is at the low level (see FIG. 6). On the other hand, in a case where each pixel 101 of the imaging device 20 is configured to include a photodiode functioning as a photoelectric conversion element, each non-exposure period is a period from a certain point of time when Vtrs falls down to a later point of time when Vdr falls down next time (see FIG. 8).

In contrast, in the seventh embodiment, when a multiple exposure image is acquired, a high-sensitivity exposure and a low-sensitivity exposure are performed alternately.

7.2 Configuration

The camera system according to the seventh embodiment may be similar in configuration to the camera system 10 according to the first embodiment, and thus a description of the constituent elements is omitted.

7.3 Operation

In the camera system according to the seventh embodiment, a seventh moving object detection process is performed instead of the first moving object detection process according to the first embodiment.

The seventh moving object detection process is described below with reference to drawings.

The seventh moving object detection process is different from the first moving object detection process according to the first embodiment in that when a multiple exposure image is acquired, the high-sensitivity exposure and the low-sensitivity exposure are performed successively and alternately. The flow chart illustrating the seventh moving object detection process is the same as the flow chart of the first moving object detection process according to the first embodiment, and thus a description of each step is omitted.

Figure 21:
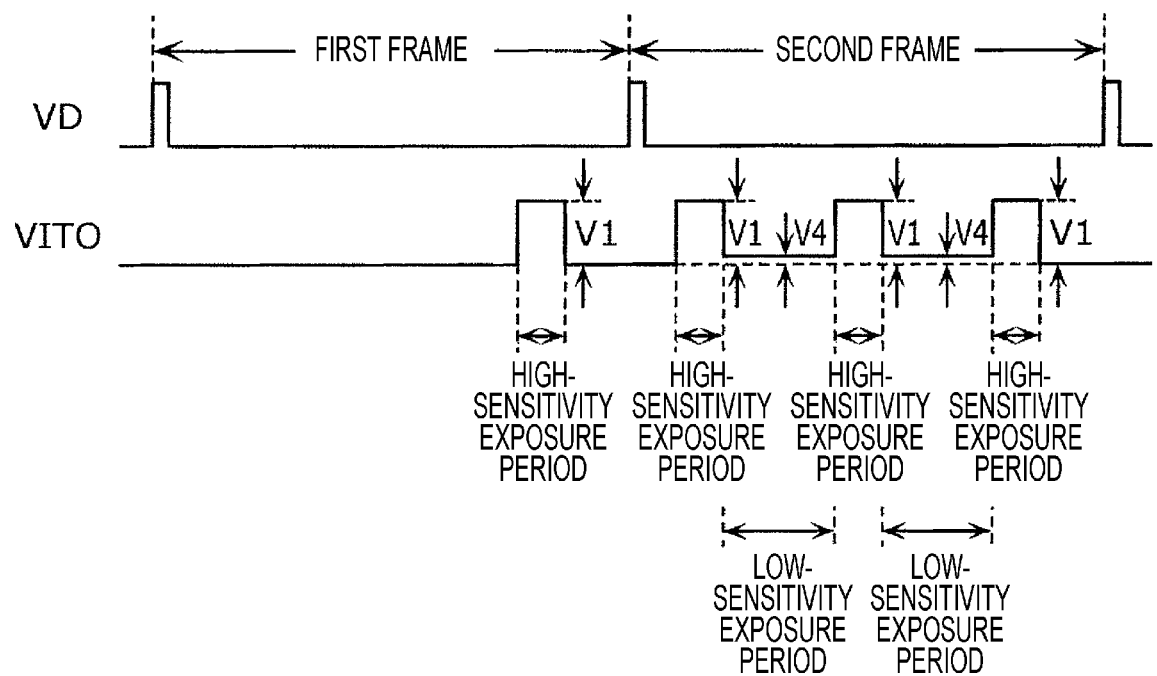
FIG. 21 is a diagram illustrating an example of operation timing in a normal exposure and a multiple exposure in two frame periods in an imaging device according to a seventh embodiment.

FIG. 21 illustrates an example of operation timing in a normal exposure and a multiple exposure in two frame periods. Note that in this example, it is assumed that each pixel 101 of the imaging device 20 is configured to include a photoelectric conversion element using a photoelectric conversion film. In FIG. 21, a normal exposure is performed in a first frame period and a multiple exposure is performed in a second frame period.

As shown in FIG. 21, during the second frame period in which a multiple exposure is performed, the voltage applied to the transparent electrode 110A is set to V1 and V4 alternately and repeatedly where the imaging device 20 has a particular sensitivity when the voltage is set to V1, while V4 is lower than V1 and higher than the low level.

7.4 Supplementary Remarks

In the camera system according to the seventh embodiment, when a multiple exposure image is acquired in the seventh moving object detection process, the high-sensitivity exposure period, in which the voltage applied to the transparent electrode 110A is set to V1, and the low-sensitivity exposure period, in which the voltage applied to the transparent electrode 110A is set to V2, are repeatedly continuously and alternately. As a result, a trajectory of a movement of a subject is formed on the acquired multiple exposure image.

Figure 22A:
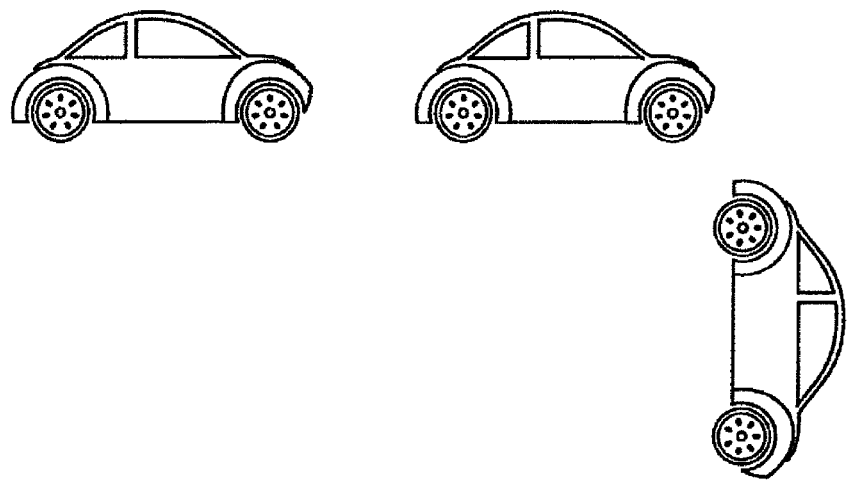
FIG. 22A is a diagram illustrating an example of a multiple exposure image acquired via a first moving object detection process.
Figure 22B:
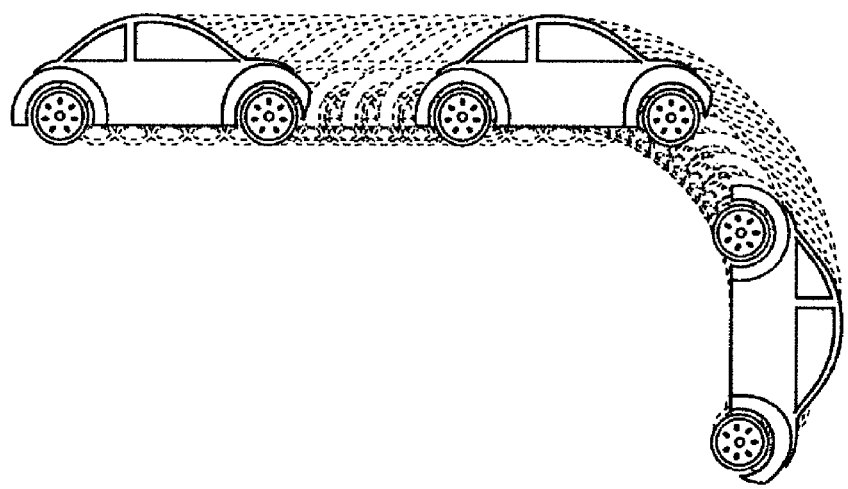
FIG. 22B is a diagram illustrating an example of a multiple exposure image acquired via a seventh moving object detection process.

FIG. 22A illustrates an example of a multiple exposure image acquired via the first moving object detection process according to the first embodiment. FIG. 22B illustrates an example of a multiple exposure image acquired via the seventh moving object detection process according to the seventh embodiment.

In FIG. 22A, images of the same subject are formed at separate locations. In contrast, in FIG. 22B, images are acquired by low-sensitivity exposures in periods between adjacent high-sensitivity exposures, and these images form a trajectory of the movement of the subject.

As described above, a trajectory of a movement of a subject appears on a multiple exposure image acquired via the seventh moving object detection process. To search for an image of a subject, it is necessary to search an area where the subject is predicted to move in a particular direction. In the present embodiment, by tracking the trajectory of the subject, it is possible to narrow a searching area for each of a plurality of images of the same subject acquired by high-sensitivity exposures. Thus, the camera system according to the seventh embodiment is capable of relatively easily detecting each of a plurality of images of the same subject acquired by high-sensitivity exposures in a multiple exposure image.

Supplements

The present disclosure has been described above by way of example with reference to the first to seventh embodiments. Note that the present disclosure is not limited to those embodiments described above, but many various modifications, changes, replacements, additions, removals, etc., may be applicable to the embodiments without departing from the spirit and scope of the present disclosure.

Some examples of modifications of the embodiments of the present disclosure are described below.

1. In the first embodiment, the traveling control system 1 includes the constituent elements shown in FIG. 1. However, in the present disclosure, the configuration of the traveling control system is not limited to the example shown in FIG.

1 as long as functions similar to those provided by the traveling control system 1 are achieved.

Figure 23:
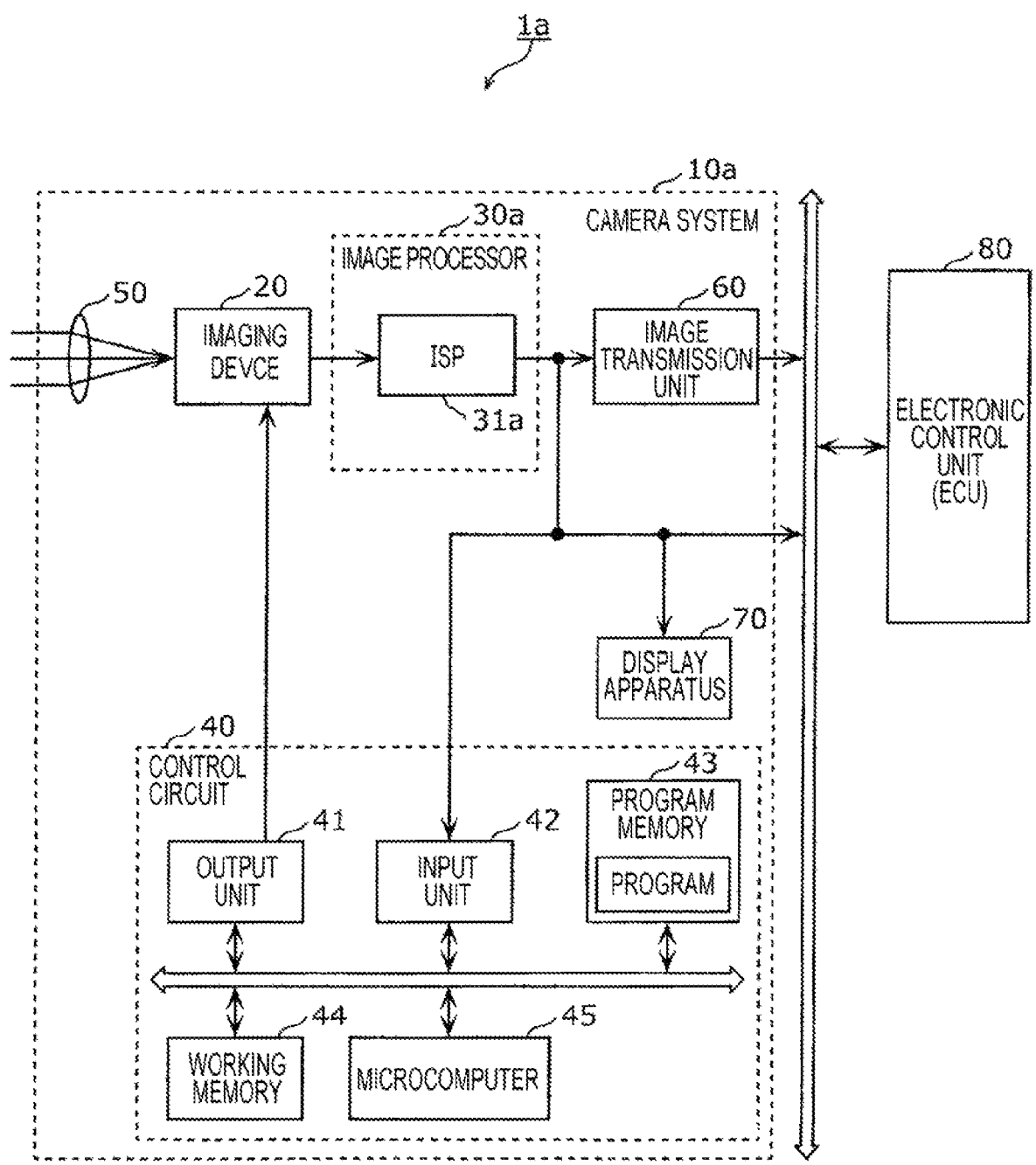
FIG. 23 is a block diagram illustrating a configuration of a traveling control system according to a modified embodiment.

FIG. 23 is a block diagram illustrating a configuration of a traveling control system 1a according to a modified embodiment.

As shown in FIG. 23, the traveling control system 1a is different from the traveling control system 1 in that the motion detection unit 32 is removed and the ISP 31 is replaced by an ISP 31a. As a result of the differences described above, the image processor 30 is replaced by an image processor 30a, and the camera system 10 is replaced by a camera system 10a.

The ISP 31a provides the functions of the ISP 31 and the functions of the motion detection unit 32. Thus, the traveling control system 1a can provide functions similar to those provided by the traveling control system 1.

2. In the third embodiment, the determination as to whether successive acquisition of multiple exposure images is to be continued or the successive acquisition of multiple exposure images is to be ended and a reference image is to be acquired is made based on the number of successive acquisitions of multiple exposure images. In the camera system according to the third embodiment, the determination described above may be made based on another criterion.

For example, the determination described above may be made based on a time during which acquiring of a multiple exposure image is continued. For another example, the determination described above may be made based on a traveling distance of a vehicle on which the imaging device 20 is installed.

The camera system and the traveling control system according to the present disclosure can be used in a wide variety of systems in which an image is acquired.

What is claimed is:

1. A camera system comprising:
an imaging device that captures a first image by a normal exposure including only one exposure and that captures a second image by a multiple exposure including a plurality of exposures; and
a control circuit, wherein
the imaging device captures the second image in a first frame period, and
the control circuit determines, based on the second image captured in the first frame period, whether to capture an image by the normal exposure or capture an image by the multiple exposure in a second frame period following the first frame period.

2. The camera system according to claim 1, further comprising
an image processor, wherein
in a case where the image processor cannot detect a first object in the second image captured in the first frame period, the control circuit determines to capture an image by the normal exposure in the second frame period.

3. The camera system according to claim 1, further comprising
an image processor, wherein
in a case where the image processor detects a first object in the second image captured in the first frame period, the control circuit determines to capture an image by the multiple exposure in the second frame period.

4. The camera system according to claim 1, wherein
the multiple exposure includes a first exposure and a second exposure different from the first exposure, and a sensitivity in the first exposure is different from a sensitivity in the second exposure.

5. The camera system according to claim 1, wherein a sensitivity in a period between adjacent two exposures out of the multiple exposure is greater than zero and less than a sensitivity in each of the adjacent two exposures.

6. The camera system according to claim 1, further comprising
an image processor that calculates, based on the second image, at least a direction of movement, a velocity, or an acceleration of a first object captured by the imaging device.

7. A camera system comprising:
an imaging device that captures a first image by a normal exposure including only one exposure and that captures a second image by a multiple exposure including a plurality of exposures; and
a control circuit, wherein
the imaging device captures the first image in a first frame period, and
the control circuit determines, based on the first image captured in the first frame period, whether to capture an image by the normal exposure or capture an image by the multiple exposure in a second frame period following the first frame period.

8. The camera system according to claim 7, further comprising
an image processor, wherein
in a case where the image processor cannot detect a first object in the first image captured in the first frame period, the control circuit determines to capture an image by the normal exposure in the second frame period.

9. The camera system according to claim 7, further comprising
an image processor, wherein
in a case where the image processor detect a first object in the first image captured in the first frame period, the control circuit determines to capture an image by the multiple exposure in the second frame period.

10. The camera system according to claim 7, wherein
the multiple exposure includes a first exposure and a second exposure different from the first exposure, and a sensitivity in the first exposure is different from a sensitivity in the second exposure.

11. The camera system according to claim 7, wherein a sensitivity in a period between adjacent two exposures out of the multiple exposure is greater than zero and less than a sensitivity in each of the adjacent two exposures.

12. The camera system according to claim 7, further comprising
an image processor that calculates, based on the second image, at least a direction of movement, a velocity, or an acceleration of a first object captured by the imaging device.

13. A camera system comprising:
an imaging device that captures a first image by a normal exposure including only one exposure and that captures a second image by a multiple exposure including a plurality of exposures; and
a control circuit, wherein
the control circuit causes the imaging device
to capture the first image in a frame period,
to capture the second image in each of one or more frame periods following the frame period, and
to capture the first image in a frame period following the one or more frame periods.

14. The camera system according to claim 13, wherein
the multiple exposure includes a first exposure and a second exposure different from the first exposure, and
a sensitivity in the first exposure is different from a sensitivity in the second exposure.

15. The camera system according to claim 13, wherein a sensitivity in a period between adjacent two exposures out of the multiple exposure is greater than zero and less than a sensitivity in each of the adjacent two exposures.

16. The camera system according to claim 13, further comprising
an image processor that calculates, based on the second image, at least a direction of movement, a velocity, or an acceleration of a first object captured by the imaging device.

* * * * *